(12) United States Patent
Shih et al.

(10) Patent No.: US 11,942,533 B2
(45) Date of Patent: Mar. 26, 2024

(54) CHANNEL STRUCTURES FOR SEMICONDUCTOR DEVICES

(71) Applicant: Taiwan Semiconductor Manufacturing Co., Ltd., Hsinchu (TW)

(72) Inventors: Ding-Kang Shih, New Taipei (TW); Pang-Yen Tsai, Jhu-bei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 151 days.

(21) Appl. No.: 17/463,123

(22) Filed: Aug. 31, 2021

(65) Prior Publication Data
US 2023/0061755 A1 Mar. 2, 2023

(51) Int. Cl.
| *H01L 29/66* | (2006.01) |
| *H01L 21/8234* | (2006.01) |
| *H01L 29/06* | (2006.01) |
| *H01L 29/78* | (2006.01) |

(52) U.S. Cl.
CPC ......... *H01L 29/66795* (2013.01); *H01L 21/823431* (2013.01); *H01L 29/0665* (2013.01); *H01L 29/785* (2013.01)

(58) Field of Classification Search
CPC ....... H01L 29/66795; H01L 21/823431; H01L 29/0665; H01L 29/785; H01L 29/66439; H01L 29/78696; H01L 29/42392; H01L 21/02532; H01L 21/02381; H01L 29/1604; H01L 29/161–167
See application file for complete search history.

(56) References Cited

U.S. PATENT DOCUMENTS

| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |

(Continued)

OTHER PUBLICATIONS

T. I. Kamins; E. C. Carr; R. S. Williams; S. J. Rosner, "Deposition of three-dimensional Ge islands on Si(001) by chemical vapor deposition at atmospheric and reduced pressures", Jan. 1, 1997, Journal of Applied Physics, 81, 211-219 (1997).*

*Primary Examiner* — Cuong B Nguyen
(74) *Attorney, Agent, or Firm* — Sterne, Kessler, Goldstein & Fox P.L.L.C.

(57) ABSTRACT

The present disclosure provides channel structures of a semiconductor device and fabricating methods thereof. The method can include forming a superlattice structure with first nanostructured layers and second nanostructured layers on a fin structure. The method can also include removing the second nanostructured layers to form multiple gate openings; forming a germanium epitaxial growth layer on the first nanostructured layers at a first temperature and a first pressure; and increasing the first temperature to a second temperature and increasing the first pressure to a second pressure over a first predetermined period of time. The method can further include annealing the germanium epitaxial growth layer at the second temperature and the second pressure in the chamber over a second predetermined period of time to form a cladding layer surrounding the first nanostructured layers.

20 Claims, 20 Drawing Sheets

(56) References Cited

U.S. PATENT DOCUMENTS

| | | |
|---|---|---|
| 9,548,303 B2 | 1/2017 | Lee et al. |
| 9,564,489 B2 | 2/2017 | Yeo et al. |
| 9,576,814 B2 | 2/2017 | Wu et al. |
| 9,601,342 B2 | 3/2017 | Lee et al. |
| 9,608,116 B2 | 3/2017 | Ching et al. |
| 10,553,678 B2 * | 2/2020 | Lee .................. H01L 29/66553 |
| 2021/0359142 A1 * | 11/2021 | Huang ................ H01L 21/0262 |

* cited by examiner

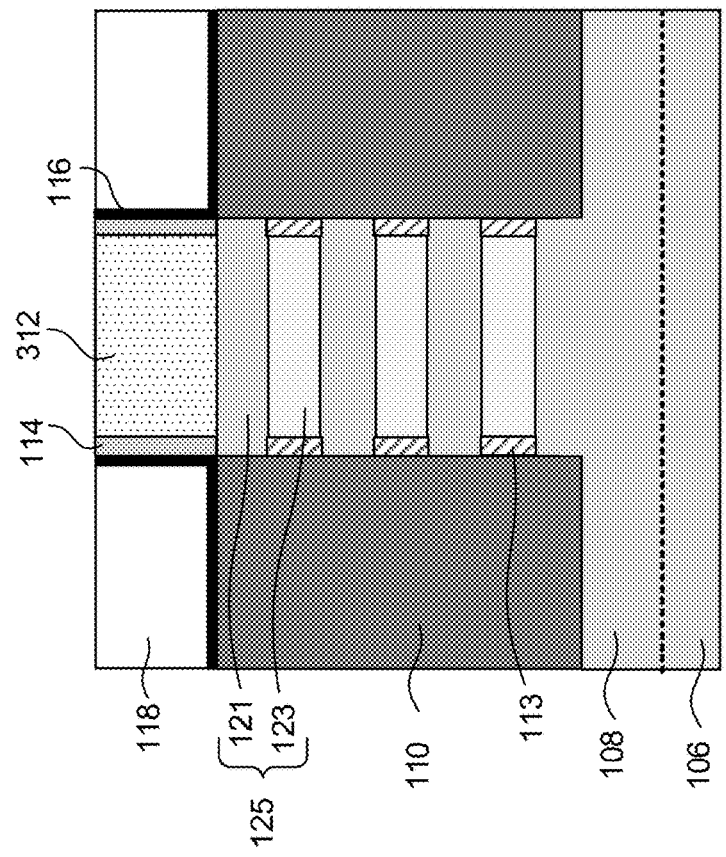
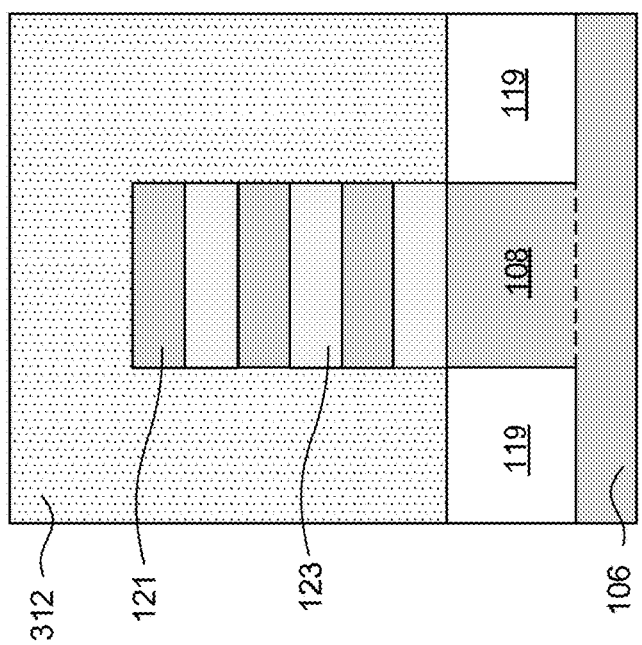
Fig. 5A
Fig. 5B

CHANNEL STRUCTURES FOR SEMICONDUCTOR DEVICES

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes.

BRIEF DESCRIPTION OF THE DRAWINGS

Aspects of this disclosure are best understood from the following detailed description when read with the accompanying figures.

FIGS. 3A-9B illustrate cross-sectional views of a semiconductor device at various stages of the fabrication process of FIG. 2, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1A:
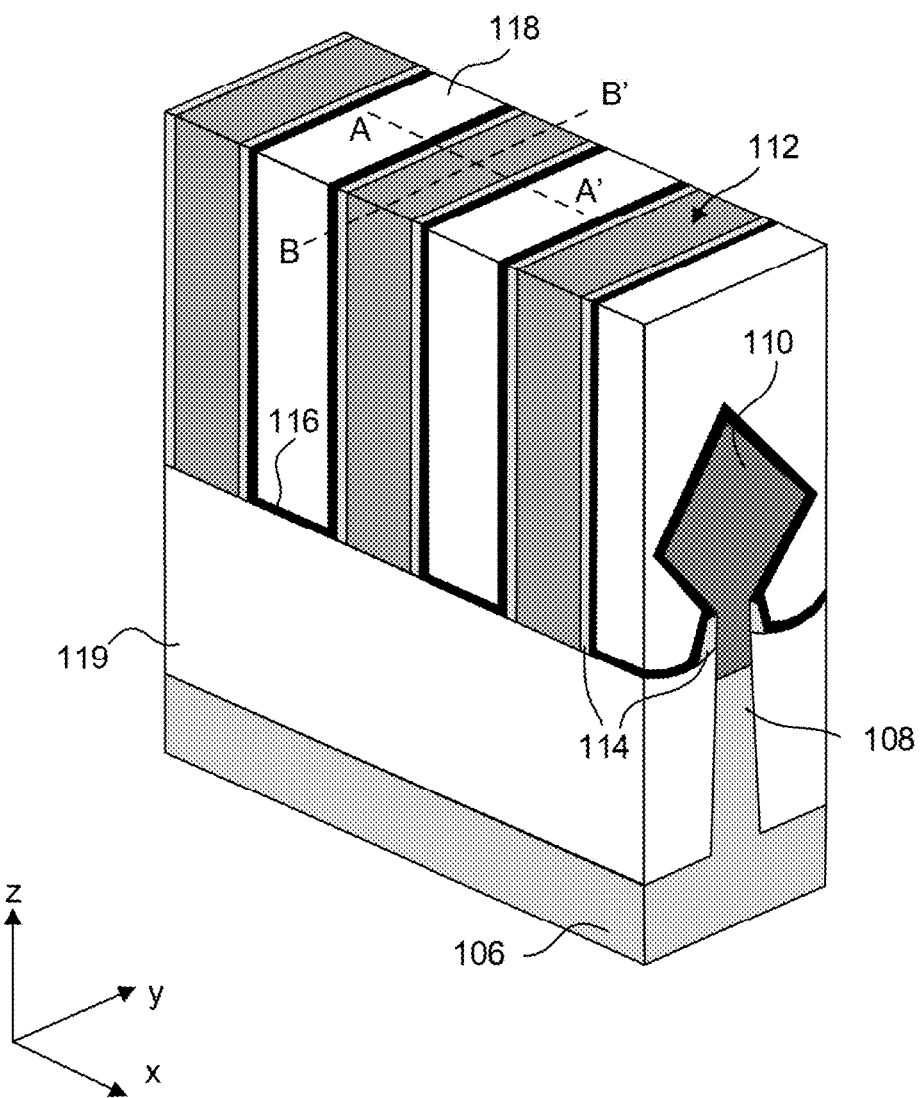
FIG. 1A illustrates an isometric view of a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

References in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

The fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

The present disclosure provides example multi-Vt devices (e.g., semiconductor device 100 of FIG. 1A) with FETs (e.g., finFETs or GAA FETs) having an improved channel structure configurations. A substantially uniform germanium (Ge) cladding layer wrapped around the silicon (Si) channel layer is critical for Ge tuning pFET Vth in scaled down advanced device structures (e.g. finFETs, nanowire, nanosheet). The present disclosure provides a thin uniform Ge cladding layer, which thickness is less than about 2 nm or less than about 1 nm.

One method to form a Ge cladding layer is by ion implanting Ge atoms in a Si channel. Such method does not require extra volume/thickness for adding the Ge cladding layer, but may only be feasible for planar device structures. The Ge ion implantation process may not be feasible in scaled down device structures, such as three-dimensional (3D) nanosheets, nanowires, and finFET structures, due to pattern geometry shadowing.

Another method to form a Ge cladding layer is by directly inserting a SiGe cladding layer covering a Si channel layer at a sheet formation stage. A Ge epitaxial growth by a chemical vapor deposition (CVD) process can form the cladding layer at certain thicknesses (e.g., larger than 5 nm), which may not accommodate scaled down device structures, such as 3D nanosheets, nanowires, and finFET structures.

Embodiments of the present disclosure provide methods to form a thin uniform Ge cladding layer for scaled down device structures, such as 3D nanosheets, nanowires, and finFET structures. The embodiments described herein are not constrained by pattern geometry by using reduced pressure CVD tools at specific design process conditions. In some embodiments, a Ge treatment less than about 1300 seconds is performed at a process temperature of about 450° C., using germane ($GeH_4$) as a Ge reacting gas, and at a partial pressure (pp) of about 4 mTorr and a reactor chamber total pressure less than about 30 Torr, to epitaxially grow a Ge layer on the surfaces of a Si channel layer. An annealing process can then be performed at about 500° C. to about 800° C. in hydrogen ($H_2$) ambient for silicon-germanium (SiGe) alloying and Ge atom thermal diffusion into the Si channel layer. As a result, an ultra-thin (e.g., thickness less than 1 nm) Ge or GeSi cladding layer can be formed on the Si channel layer.

In some embodiments, a Ge treatment followed by an annealing process can be cyclically repeated to avoid uncontrolled Ge island-to-island mergers in scaled down device structures which can cause device performance failure. Each cycle of Ge treatment can be performed in a time duration to form a Ge layer with a thickness less than a critical thickness of a Ge epitaxial growth from 2D to 3D. Each cycle of annealing process can be performed for surface Ge atom redistribution and diffusion. The cycles of Ge treatment and annealing process can be repeated until the formed Ge/GeSi cladding layer reaches a desired thickness and/or the surface Ge composition reaches a desired percentage, according to some embodiments.

Figure 1B:
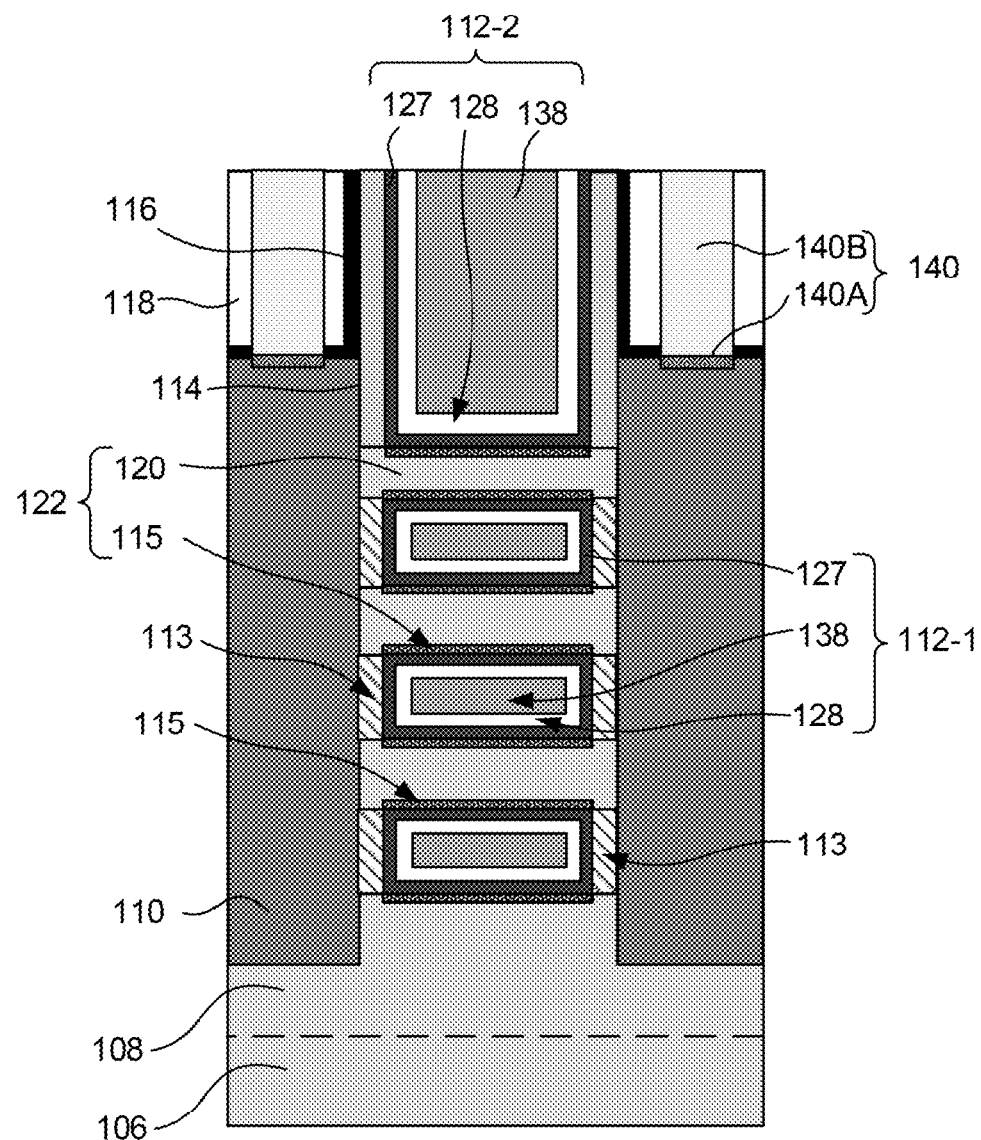
FIG. 1B illustrates a cross-sectional view of a portion of the semiconductor device of FIG. 1A along line A-A', in accordance with some embodiments.
Figure 1D:
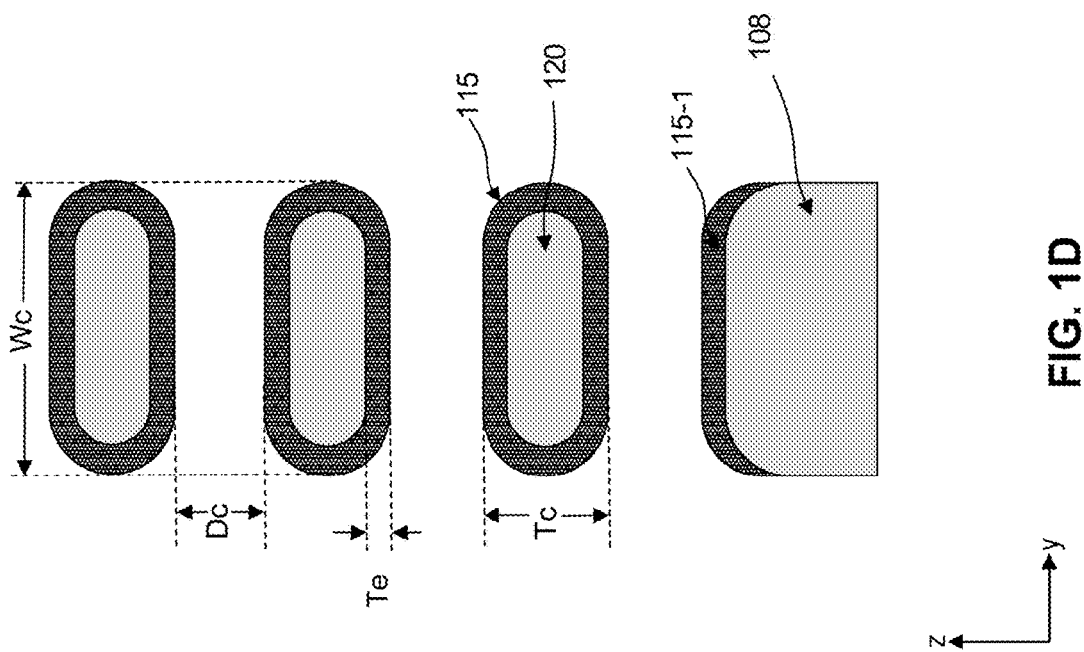
FIG. 1D illustrates a cross-sectional view of an enlarged portion of certain components of the semiconductor device of FIG. 1C, in accordance with some embodiments.
Figure 1C:
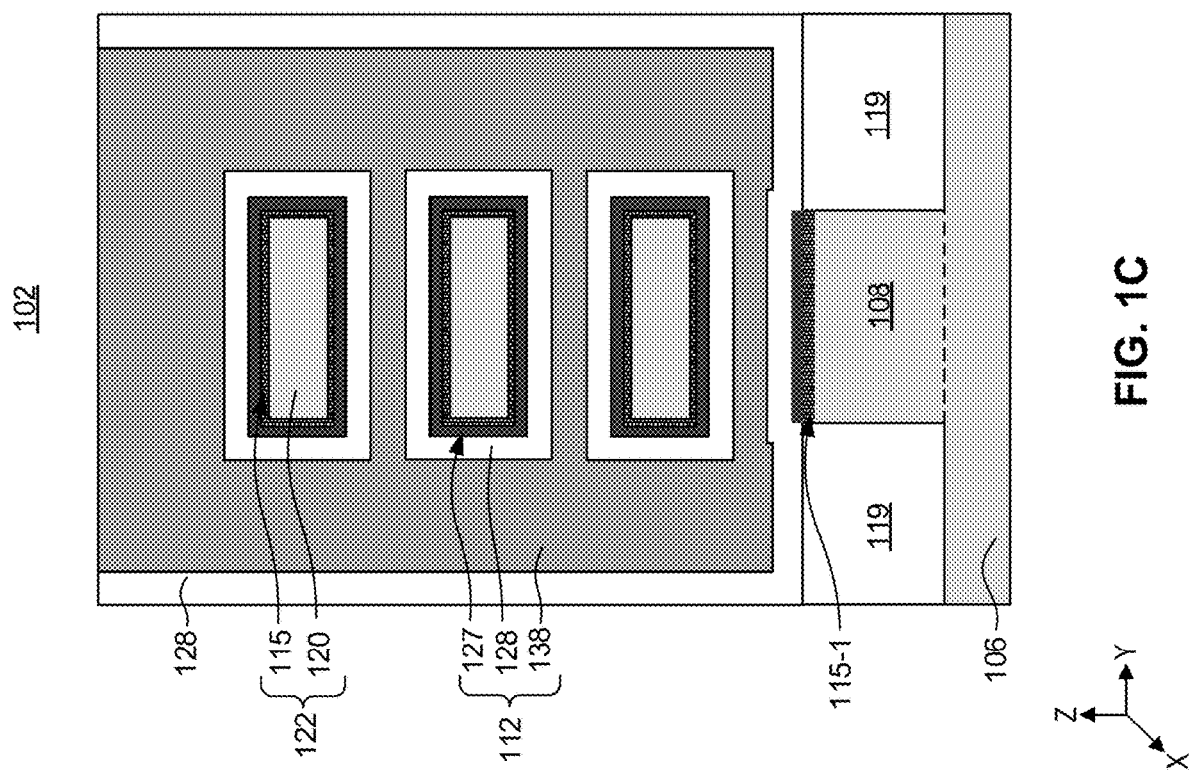
FIG. 1C illustrates a cross-sectional view of a portion of the semiconductor device of FIG. 1 along line B-B', in accordance with some embodiments.

FIG. 1A illustrates an isometric view of a semiconductor device 100, according to some embodiments. FIG. 1B illustrates a cross-sectional view of a FET 102 of semiconductor device 100 along line A-A' with additional structures that are not shown in FIG. 1A for simplicity. FIG. 1C illustrates a cross-sectional view of FET 102 of semiconductor device 100 along line B-B' with additional structures that are not shown in FIG. 1A for simplicity. The discussion of elements in FIGS. 1A-1C with the same annotations applies to each other, unless mentioned otherwise. In some embodiments, FET 102 can represent an n-type FET (NFET) or a p-type FET (PFET) and the discussion of FET 102 applies to both NFET and PFET, unless mentioned otherwise.

Referring to FIGS. 1A-1C, semiconductor device 100 can include a plurality of FETs 102. Semiconductor device 100 can include an array of gate structures 112 disposed on a fin structure 108 and an array of S/D regions 110 disposed on portions of fin structure 108 that are not covered by gate structures 138. Semiconductor device 100 can further include gate spacers 114, shallow trench isolation (STI) regions 119, etch stop layers (ESLs) 116, and interlayer dielectric (ILD) layers 118. In some embodiments, gate spacers 114, STI regions 119, ESLs 116, and ILD layers 118 can include an insulating material, such as silicon oxide, silicon nitride (SiN), silicon carbon nitride (SiCN), silicon oxycarbon nitride (SiOCN), and silicon germanium oxide. In some embodiments, gate spacers 114 can have a thickness of about 2 nm to about 9 nm for adequate electrical isolation of gate structures 138 from adjacent structures.

FET 102 of semiconductor device 100 can be formed on a substrate 106. There may be other FETs and/or structures (e.g., isolation structures) formed on substrate 106. Substrate 106 can be a semiconductor material, such as silicon, germanium (Ge), silicon germanium (SiGe), a silicon-on-insulator (SOI) structure, and a combination thereof. Further, substrate 106 can be doped with p-type dopants (e.g., boron, indium, aluminum, or gallium) or n-type dopants (e.g., phosphorus or arsenic). In some embodiments, fin structure 108 can include a material similar to substrate 106 and extend along an X-axis.

Referring to FIGS. 1B and 1C, cross-sectional views of FET 102 of semiconductor device 100 along line A-A' (i.e., X-axis) and line B-B' (i.e., Y-axis) are illustrated respectively. In some embodiments, as illustrated in FIG. 1B, FET 102 of semiconductor device 100 can include (i) fin structure 108 on substrate 106, (ii) stacks of channel structures 122 disposed on fin structure 108, (iii) gate structure 112 disposed on and wrapped around respective channel structures 122 (iv) epitaxial S/D regions 110 disposed on portions of fin structure 108 that are adjacent to channel structures 122, (v) S/D contact structures 140 disposed on epitaxial S/D regions 110. As used herein, the term "nanostructure" or "nanostructured" defines a structure, layer, and/or region as having a horizontal dimension (e.g., along X- and/or Y-axis) and/or a vertical dimension (e.g., along Z-axis) less than, for example, 100 nm. In some embodiments, FET 102 can have fin regions (not shown) instead of nanostructured channel regions 122. Such finFETs 102 can have gate structures 112 disposed on the fin regions.

Fin structure 108 can be formed from substrate 106 and can extend along an X-axis. Epitaxial S/D regions 110 can be grown on fin structure 108 and can include epitaxially-grown semiconductor materials similar to or different from each other. In some embodiments, the epitaxially-grown semiconductor material can include the same material or a different material from the material of substrate 106. Epitaxial S/D regions 110 can be n-type or p-type. As used herein, the term "p-type" defines a structure, layer, and/or region as being doped with p-type dopants, such as boron. As used herein, the term "n-type" defines a structure, layer, and/or region as being doped with n-type dopants, such as phosphorus. In some embodiments, n-type S/D regions 110 can include SiAs, SiC, or SiCP and p-type S/D regions 110 can include SiGe, SiGeB, GeB, SiGeSnB, a III-V semiconductor compound, any other suitable semiconductor material, or a combination thereof.

In some embodiments, each of S/D contact structures 140 on an epitaxial S/D region 110 can include (i) a silicide layer 140A and (ii) a contact plug 140B disposed on silicide layer 140A. In some embodiments, silicide layers 140A can include nickel silicide (NiSi), tungsten silicide (WSi2), titanium silicide (TiSi2), cobalt silicide (CoSi2), or other suitable metal silicides. In some embodiments, contact plugs 140B can include conductive materials, such as cobalt (Co), tungsten (W), ruthenium (Ru), iridium (Ir), nickel (Ni), Osmium (Os), rhodium (Rh), aluminum (Al), molybdenum (Mo), copper (Cu), zirconium (Zr), stannum (Sn), silver (Ag), gold (Au), zinc (Zn), cadmium (Cd), other suitable conductive materials, and a combination thereof.

In some embodiments, each nanostructured channel region 122 can include a channel layer 120 having semiconductor materials similar to or different from substrate 106. For example, channel layer 120 can be an N type channel layer including Si, silicon arsenic (SiAs), silicon phosphide (SiP), silicon carbide (SiC), silicon carbon phosphide (SiCP), or other suitable semiconductor materials. As another example, channel layer 120 can be a P type channel layer including Si, silicon arsenic (SiAs), silicon phosphide (SiP), silicon carbide (SiC), silicon carbon phosphide (SiCP), or other suitable semiconductor materials.

Each nanostructured channel region 122 can further include a cladding layer 115 having semiconductor materials different from channel layer 120. In some embodiments, cladding layer 115 can be a thin film containing germanium (Ge) atoms, such as a Ge film and a SiGe alloy film. In some embodiments, a concentration of Ge atoms in cladding layer 115 can be in between about 10% and about 40%. The Ge atoms in cladding layer 115 can reduce pFET threshold voltages $V_{th}$. In some embodiments, cladding layer 115 can be a substantially uniform film located on both top and bottom surfaces of each channel layer 120 in an X-Z plane as shown in FIG. 1B, and surrounding around each channel layer 120 in a Y-Z plane as shown in FIG. 1C. In some embodiments, the Ge film or SiGe film 115-1 may also be formed on a top surface of fin structure 108, as shown in FIGS. 1C and 1D.

Though rectangular cross-sections of channel structures 122 are shown in FIG. 1C, channel structures 122 can have cross-sections of other geometric shapes (e.g., circular, elliptical, triangular, or polygonal). For example, as illustrated in FIG. 1D, channel structures 122 can have non-perfect rectangular cross-sections with rounded corners. In some embodiments, a width We of channel structures 122 in Y-direction can be in a range from about 5 nm to about 20 nm, a thickness Tc of channel structures 122 in Z-direction can be in a range from about 5 nm to about 10 nm.

As described above, the Ge/SiGe film formed by inserting a SiGe cladding layer to cover Si channel has an undesired thickness larger than 4 nm, such as about 4 nm to about 5 nm. Such large thickness of Ge/SiGe film reduces the vertical distance between adjacent channels, resulting in narrow spaces for gate structures formed between the channels. The present disclosure provides methods for forming a substantially uniform cladding layer 115 with a thickness Te less than about 2 nm or even less than about 1 nm, as shown in FIG. 1D. As a result, a distance Dc of channel structures 122 in Z-direction can be in a range from about 5 nm to about 10 nm, allowing sufficient space for forming a multilayer gate structure between adjacent channel structures 122.

As illustrated in FIG. 1C, in some embodiments, gate structures 112 can be multi-layered structures and can surround channel structures 122, for which gate structures 112 can be referred to as "gate-all-around (GAA) structures" or "horizontal gate-all-around (HGAA) structures." As illustrated in FIG. 1B, gate portions 112-1 of gate structures 112 surrounding channel structures 122 can be electrically isolated from adjacent S/D regions 110 by inner spacers 113. Gate portions 112-2 of gate structures 112 disposed on the stacks of channel structures 122 can be electrically isolated from adjacent S/D regions 110 by gate spacers 114. Inner spacers 113 and gate spacers 114 can include an insulating material, such as silicon dioxide (SiO$_2$), silicon nitride (SiN), silicon carbon nitride (SiCN), silicon oxycarbonitride (SiOCN), and other suitable insulating materials.

In some embodiments, gate lengths of gate structures 112 are substantially equal to each to other. Gate structures 112 can include (i) interfacial oxide (IO) layers 127, (ii) high-k (HK) gate dielectric layers 128, and (iii) gate metal fill layers 138. As shown in FIGS. 1B and 1C, channel structures 122 can be wrapped around by IO layers 127 and HK gate dielectric layers 128 to fill the spaces between adjacent channel structures 122. Accordingly, channel structures 122 can be electrically isolated from each other to prevent shorting between gate structures 112 and S/D regions 110 during operation of finFET 102.

IO layers 127 can be disposed on channel structures 122. In some embodiments, IO layers 127 can include SiO$_2$, silicon germanium oxide (SiGeO$_x$), germanium oxide (GeO$_x$), or other suitable oxide materials. HK gate dielectric layers 128 can be disposed on IO layers 127 and can include (i) a high-k dielectric material, such as hafnium oxide (HfO$_2$), titanium oxide (TiO$_2$), hafnium zirconium oxide (HfZrO), tantalum oxide (Ta$_2$O$_3$), hafnium silicate (HfSiO$_4$), zirconium oxide (ZrO$_2$), and zirconium silicate (ZrSiO$_2$), and (ii) a high-k dielectric material having oxides of lithium (Li), beryllium (Be), magnesium (Mg), calcium (Ca), strontium (Sr), scandium (Sc), yttrium (Y), zirconium (Zr), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), lutetium (Lu), (iii) a combination thereof, or (iv) other suitable high-k dielectric materials. As used herein, the term "high-k" refers to a high dielectric constant. In the field of semiconductor device structures and manufacturing processes, high-k refers to a dielectric constant that is greater than the dielectric constant of SiO$_2$ (e.g., greater than 3.9).

In some embodiments, gate metal fill layers 138 can include a suitable conductive material, such as tungsten (W), titanium (Ti), silver (Ag), ruthenium (Ru), molybdenum (Mo), copper (Cu), cobalt (Co), aluminum (Al), iridium (Ir), nickel (Ni), other suitable conductive materials, and a combination thereof. In some embodiments, gate metal fill layers 138 can include a substantially fluorine-free metal layer (e.g., fluorine-free W). The substantially fluorine-free metal layer can include an amount of fluorine contaminants less than about 5 atomic percent in the form of ions, atoms, and/or molecules.

Figure 2:
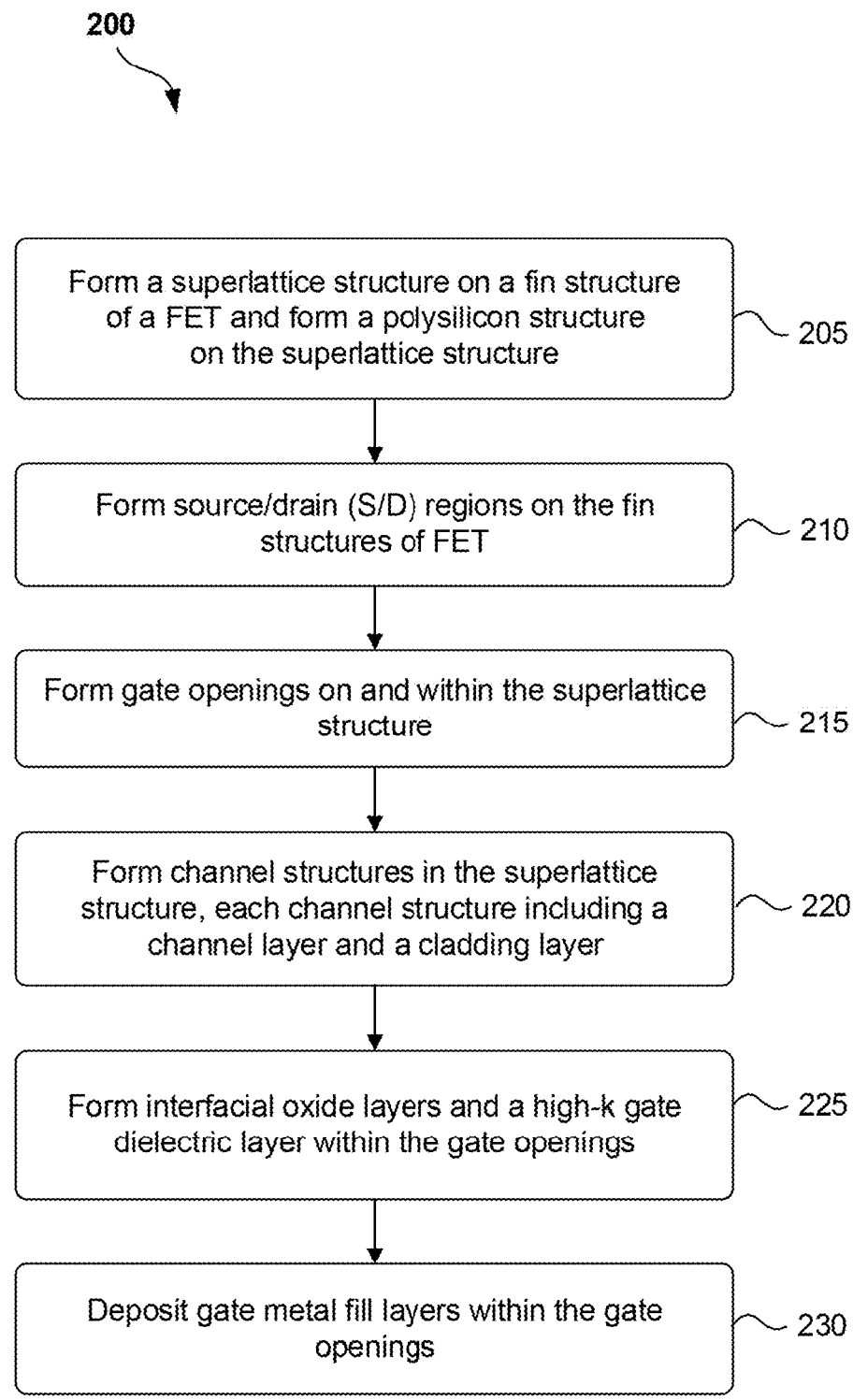
FIG. 2 is a flow diagram of a method for fabricating a semiconductor device, in accordance with some embodiments.

FIG. 2 is a flow diagram of an example method 200 for fabricating FET 102 of semiconductor device 100, according to some embodiments. For illustrative purposes, the operations illustrated in FIG. 2 will be described with reference to the example fabrication process for fabricating FET 102 as illustrated in FIGS. 3A-9B. FIGS. 3A-9B are cross-sectional views of FET 102 along lines A-A' and B-B' of semiconductor device 100 at various stages of fabrication, according to various embodiments. Operations can be performed in a different order or not performed depending on specific applications. It should be noted that method 200 may not produce a complete FET 102. Accordingly, it is understood that additional processes can be provided before, during, and after method 200, and that some other processes may only be briefly described herein. Elements in FIGS. 3A-9B with the same annotations as elements in FIGS. 1A-1D are described above.

Figure 3B:
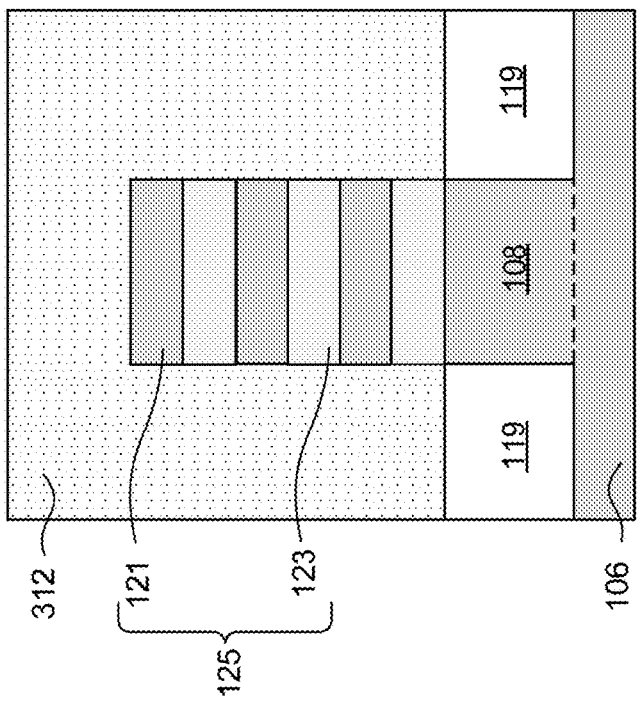
Figure 3B:
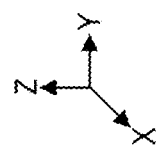
Figure 3A:
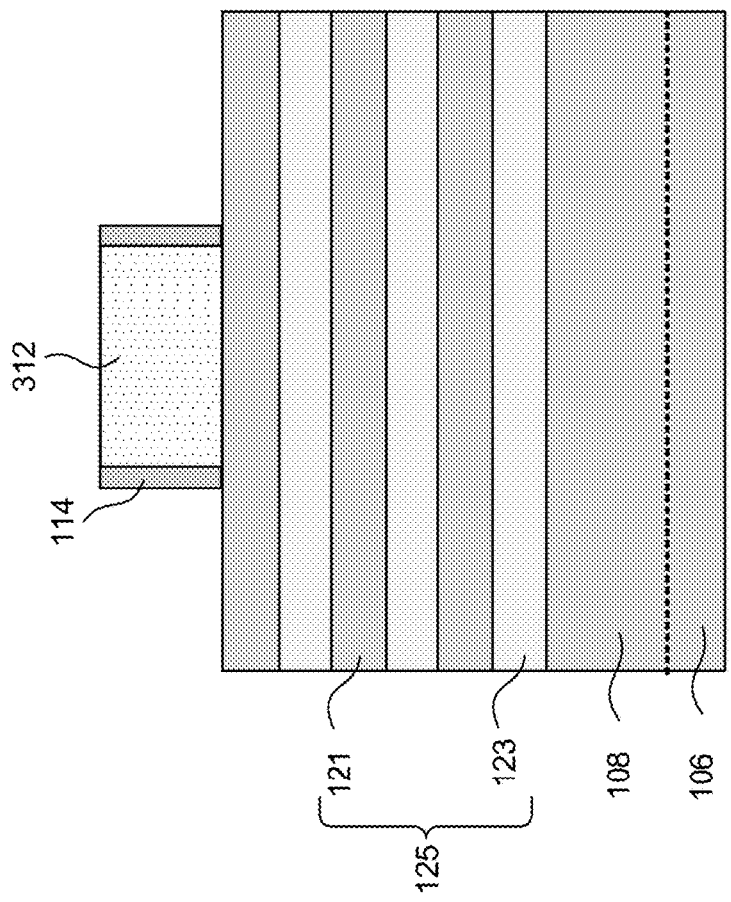
Figure 3A:
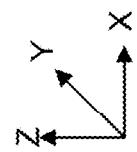

In operation 205, a superlattice structure can be formed on a fin structure of a FET, and a polysilicon structure can be formed on the superlattice structure. For example, as shown in FIGS. 3A-3B, superlattice structure 125 can be epitaxially formed on fin structure 108. Superlattice structure 125 can include nanostructured layers 121 and 123 arranged in an alternating configuration. In some embodiments, nanostructured layers 121 include materials similar to each other and nanostructured layers 123 include materials similar to each other. In some embodiments, nanostructured layers 121 can include any suitable crystallinity materials such as Si, SiGe, and group III-IV elements (e.g., GaAs, InP). In some embodiments, nanostructured layers 121 can include Si without any substantial amount of Ge (e.g., with no Ge) and nanostructured layers 123 can include SiGe. During subsequent processing, polysilicon structure 312 and nanostructured layers 123 can be replaced in a gate replacement process to form gate structures 112. In some embodiments, polysilicon structure 312 can be formed on the top surface of superlattice structure 125 in an X-Z plane as shown in FIG. 3A, and can be formed on the top surface and both sides of superlattice structure 125 and on shallow trench isolation (STI) regions 119 in a Y-Z plane as shown in FIG. 3B.

Figures 4A, 4B:
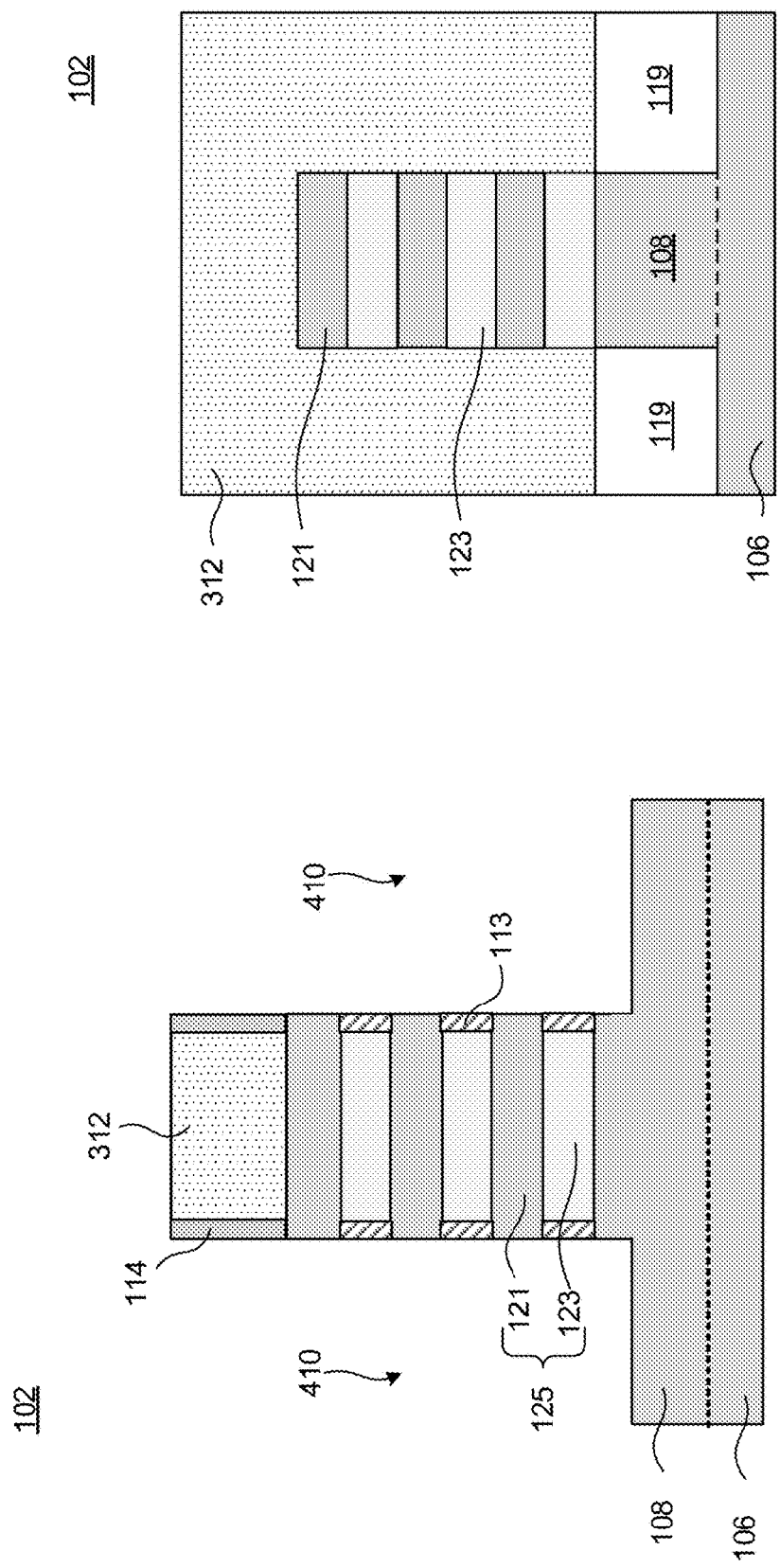

Referring to FIG. 2, in operation 210, S/D regions can be formed on the fin structure of FET. For example, as described with reference to FIGS. 4A-5B, S/D regions 110 are formed on fin structure 108 and on both sides of superlattice structure 125. S/D regions 110 can be either n-type S/D regions or and p-type S/D regions. The selective formation of S/D regions 110 can include sequential operations of (i) forming S/D openings 410, through superlattice structure 125, on portions of fin structure 108 that are not underlying polysilicon structures 312, as shown in FIGS. 4A-4B, and (ii) epitaxially growing n-type or p-type semiconductor materials within S/D openings 410, as shown in FIGS. 5A-5B. In some embodiments, inner spacers 113 can be formed between operations (i) and (ii) of the formation process of epitaxial S/D regions 110P, as shown in FIG. 4A. After the formation of S/D regions 110, ESL 116 and ILD layer 118 can be formed on S/D regions 110 to form the structures of FIGS. 5A-5B.

Figure 6B:
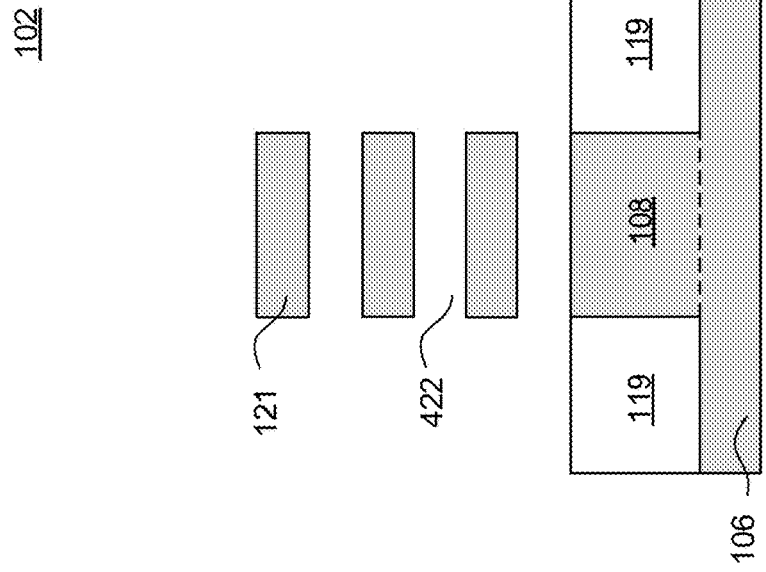
Figure 6A:
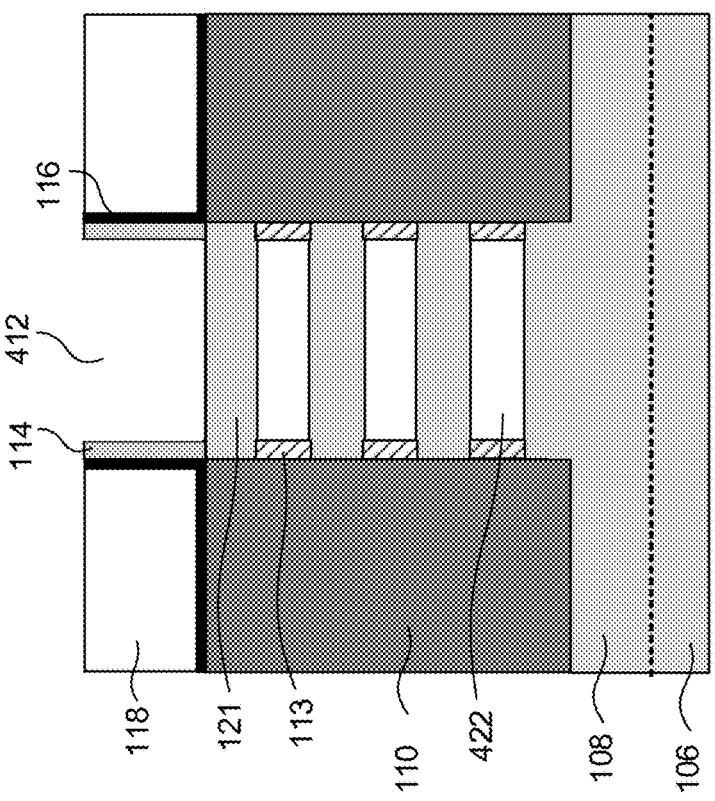

Referring to FIG. 2, in operation 215, gate openings are formed on and within the superlattice structure. For example, as shown in FIGS. 6A-6B, gate openings 412 and 422 can be formed on and within superlattice structure 125. The formation of gate openings 412 and 422 can include sequential operations of (i) forming a masking layer (not shown) on the structure of FIGS. 5A-5B, (ii) etching polysilicon structure 312 from the structure of FIGS. 5A-5B, (iii) etching nanostructured layers 123 from the structure of FIGS. 5A-5B, and (iv) removing the masking layer from the structure of FIGS. 5A-5B.

Figures 7A, 7B:
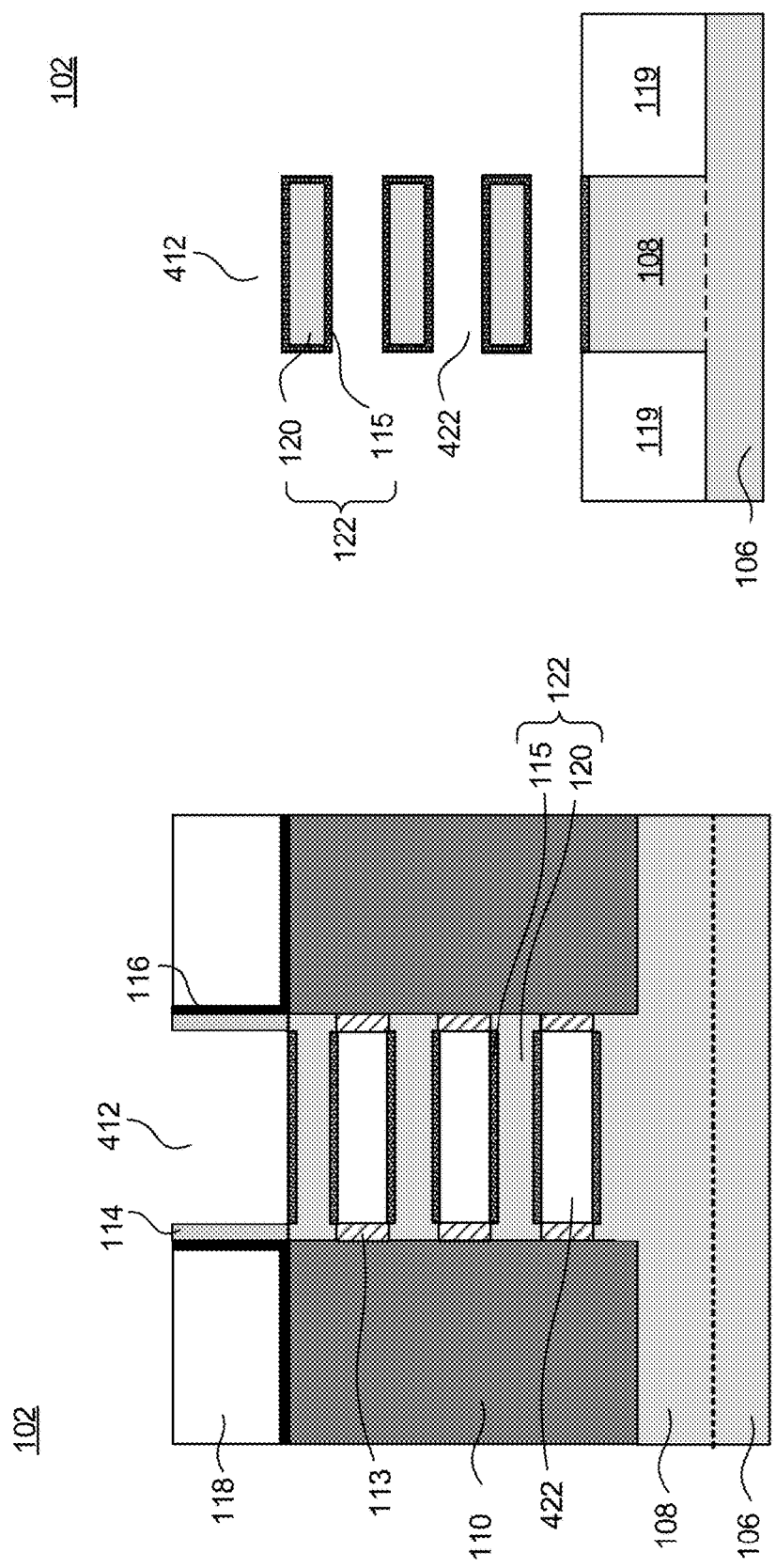

Referring to FIG. 2, in operation 220, a plurality of channel structures are formed in the superlattice structure. Each channel structure can include a channel layer and a cladding layer. For example, as shown in FIGS. 7A-7B, a cladding layer 115 can be formed on and/or within outer surfaces of nanostructured layers 121 that are exposed by gate openings 412 and 422, and the remaining portions of nanostructured layers 121 that are wrapped by the formed cladding layers 115 can form channel layers 120. In some embodiments, cladding layer 115 can be formed on the top and bottom surfaces of each channel layer 120 in an X-Z plane as shown in FIG. 7A, and can be formed to surround each channel layer 120 in a Y-Z plane as shown in FIG. 7B. In some embodiments, the plurality of channel structures can be formed by one or more Ge treatment processes, such as one or more Ge deposition processes and/or Ge doping processes. The process tools for the one or more Ge treatment processes can include furnace, physical vapor deposition (PVD), chemical vapor deposition (CVD), molecular beam epitaxy (MBE), and/or atomic layer deposition (ALD) tools. In the following descriptions in connection with FIGS. 10-16D, CVD processes using reduced pressure CVD tools at specific design process conditions are used as examples to describe the details of the formation of channel structures 120. Further details on embodiments of operation 220 are described below in FIGS. 10 and 15.

Referring to FIG. 2, in operations 225-230, GAA structures are formed in the gate openings. For example, based on operations 225-230, gate structures 112 can be formed surrounding channel structures 122, as described with reference to FIGS. 8A-9B.

Referring to FIG. 2, in operation 225, interfacial oxide layers and an HK gate dielectric layer are deposited and annealed within the gate openings. For example, as described with reference to FIGS. 8A-8B, IO layers 127 and HK gate dielectric layer 128 can be deposited and annealed within gate openings 412 and 422. IO layers 127 can be formed on exposed surfaces of channel structures 122 within respective gate openings 412 and 422. In some embodiments, IO layers 127 can be formed by exposing channel structures 122 to an oxidizing ambient. The oxidizing ambient can include a combination of ozone ($O_3$), a mixture of ammonia hydroxide, hydrogen peroxide, and water ("SC1 solution"), and/or a mixture of hydrochloric acid, hydrogen peroxide, water ("SC2 solution").

Figure 8B:
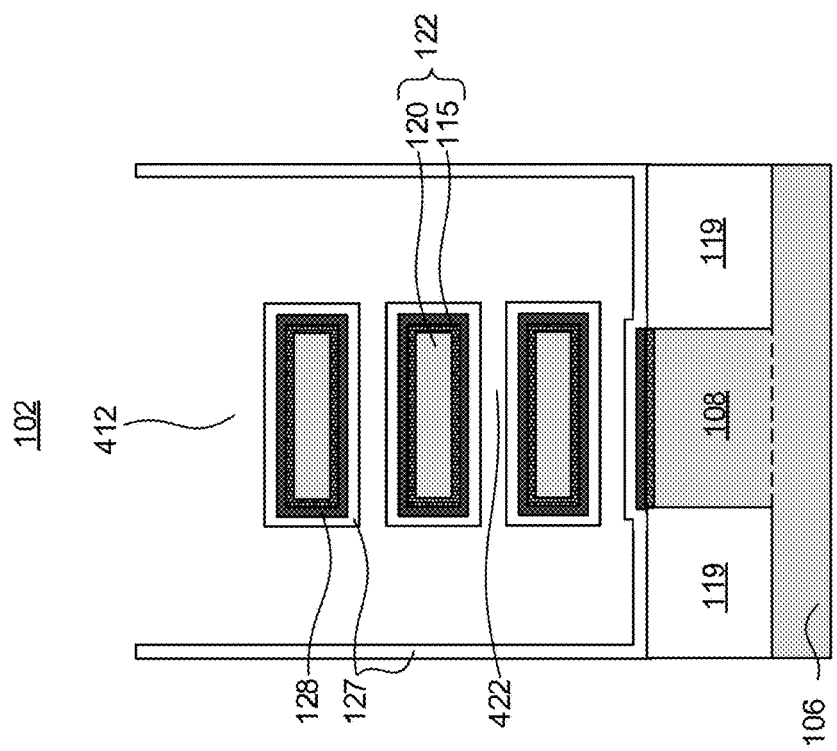
Figure 8A:
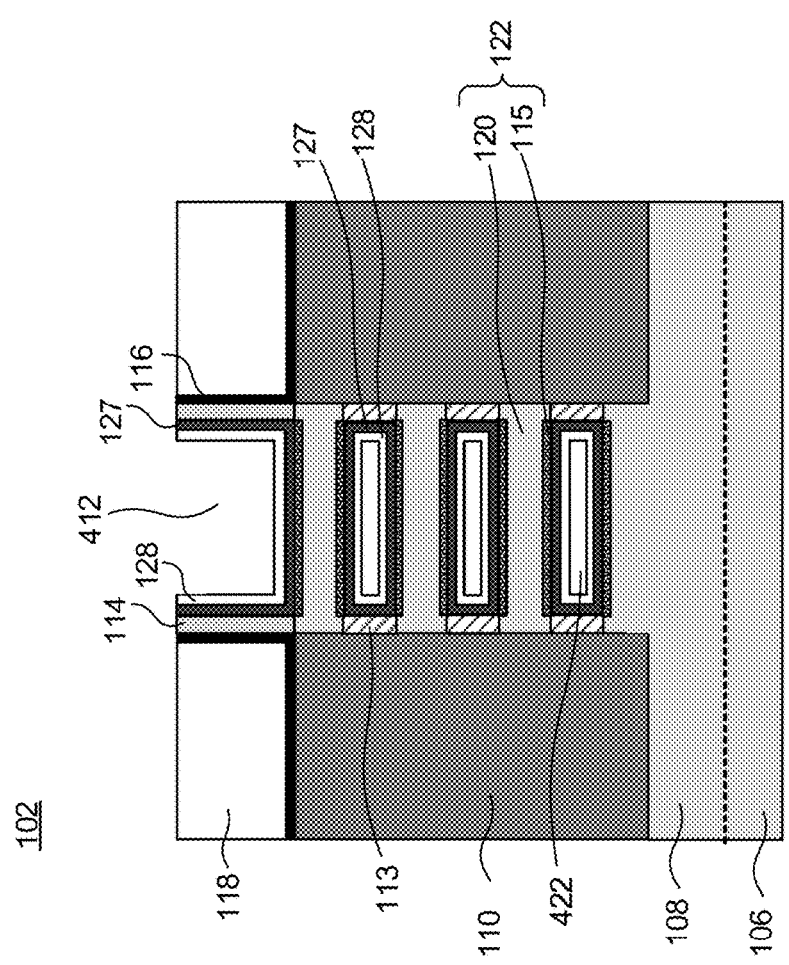

The deposition of HK gate dielectric layer 128 can include depositing a HK gate dielectric material within gate openings 412 and 422 after the formation of IO layers 127, as shown in FIGS. 8A-8B. In some embodiments, HK gate dielectric layer 128 can be formed with an ALD process using hafnium chloride ($HfCl_4$) as a precursor at a temperature ranging from about 250° C. to about 350° C. Other temperature ranges are within the scope of the disclosure. In some embodiments, the formation of HK gate dielectric layer 128 can be followed by an annealing process to improve the electrical characteristics and/or reliability of IO layers 127 and/or HK gate dielectric layer 128.

Figures 9A, 9B:
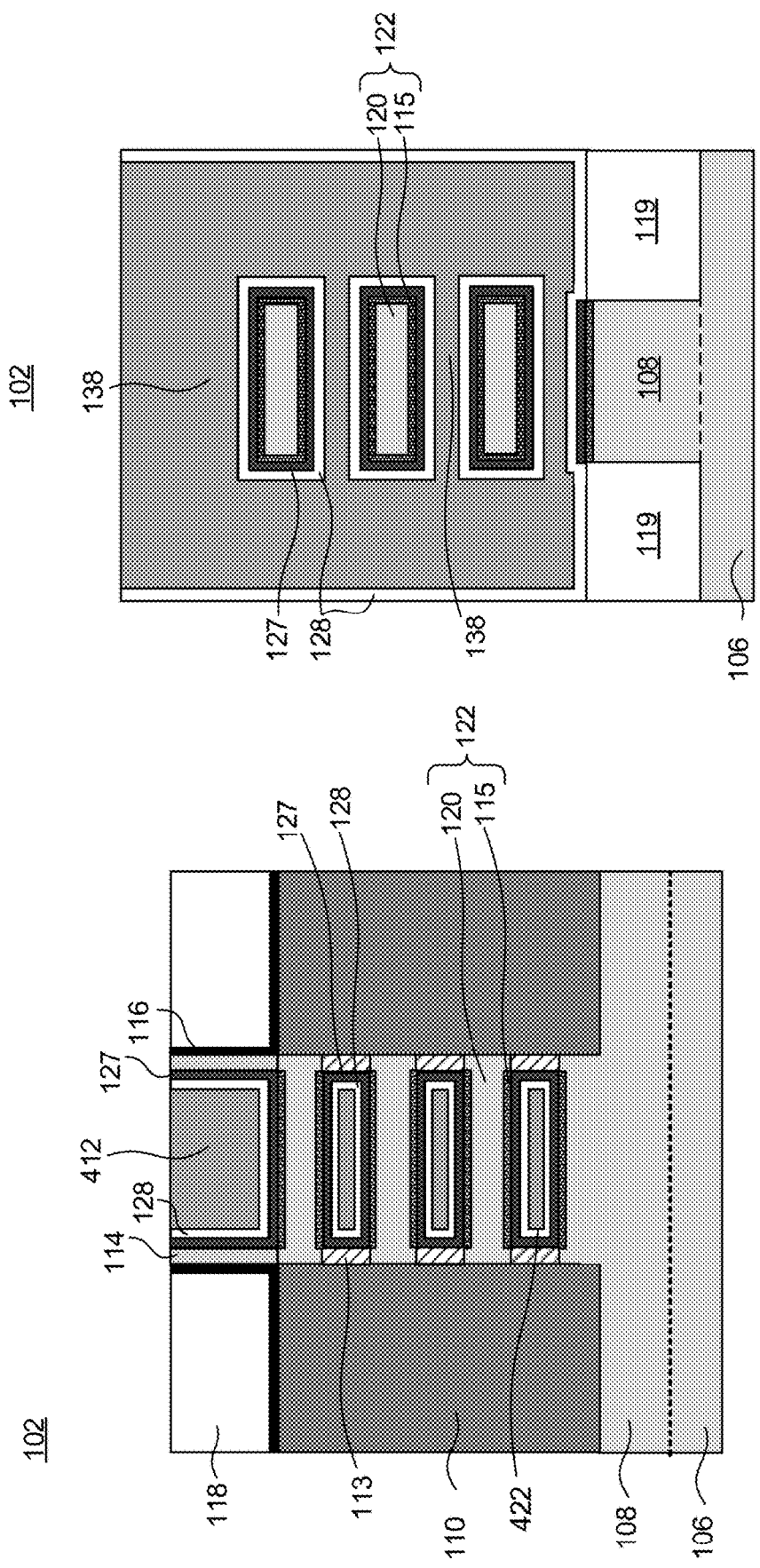

Referring to FIG. 2, in operation 230, gate metal fill layers are deposited on the HK gate dielectric layers. For example, as shown in FIGS. 9A-9B, gate metal fill layers 138 are deposited on HK gate dielectric layers 128. The deposition of gate metal fill layers 138 can include depositing a fluorine-free metal layer (e.g., a FFW layer) within gate openings 412 and 422 of FIGS. 8A-8B at the same time. The deposition of the fluorine-free metal layer within gate openings 412 can be a bottom-up deposition process, while the deposition of the fluorine-free metal layer within gate openings 422 between channel structures 122 can be a conformal deposition process.

The deposition of the fluorine-free metal layer can include depositing the fluorine-free metal layer with an ALD process using tungsten pentachloride ($WCl_5$) or Tungsten hexachloride ($WCl_6$) and $H_2$ as precursors at a temperature ranging from about 400° C. to about 500° C. Other temperature ranges are within the scope of the disclosure. In some embodiments, the fluorine-free metal layer can be deposited in an ALD process of about 160 cycles to about 320 cycles, where one cycle can include sequential periods of: (i) first precursor gas (e.g., $WCl_5$ or $WCl_6$) flow, (ii) a first gas purging process, (iii) a second precursor gas (e.g., $H_2$) gas flow, and (iv) a second gas purging process.

After the deposition of gate metal fill layers 138, IO layer 127, HK gate dielectric layer 128, and/or gate metal fill layer 138 can be polished by a chemical mechanical polishing (CMP) process to substantially coplanarize top surfaces of IO layer 127, HK gate dielectric layer 128, and/or gate metal fill layer 138 with a top surface of ILD layer 118, as shown in FIGS. 9A-9B. In some embodiments, after the CMP process, S/D contact structures 140 as shown in FIG. 1B can be formed.

Figure 10:
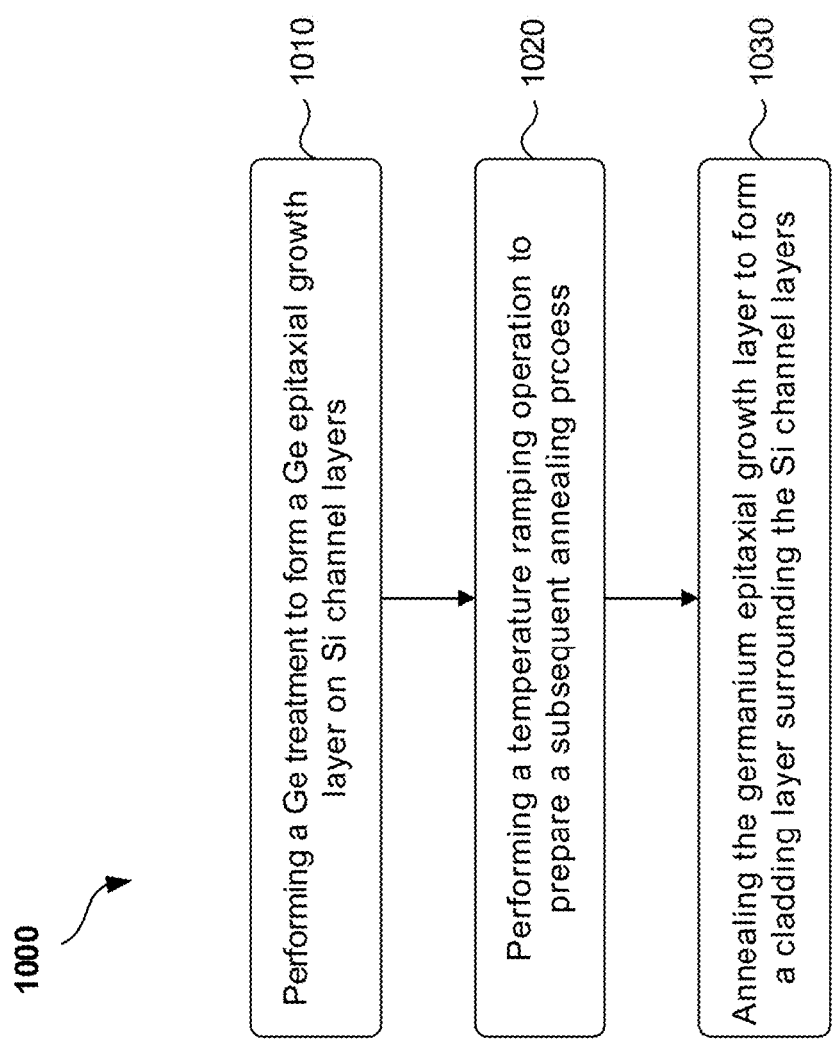
FIG. 10 is a flow diagram of a method for fabricating a channel structure, in accordance with some embodiments.
Figure 11B:
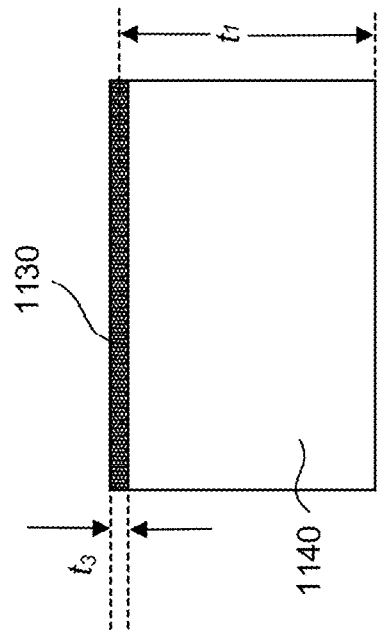
FIG. 11A-11B are cross-sectional views of a portion of a channel structure at various stages of method of FIG. 10, in accordance with some embodiments.
Figure 11A:
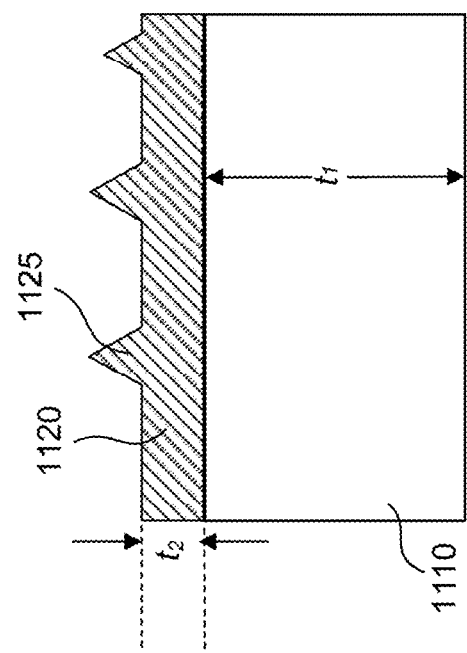
Figure 15:
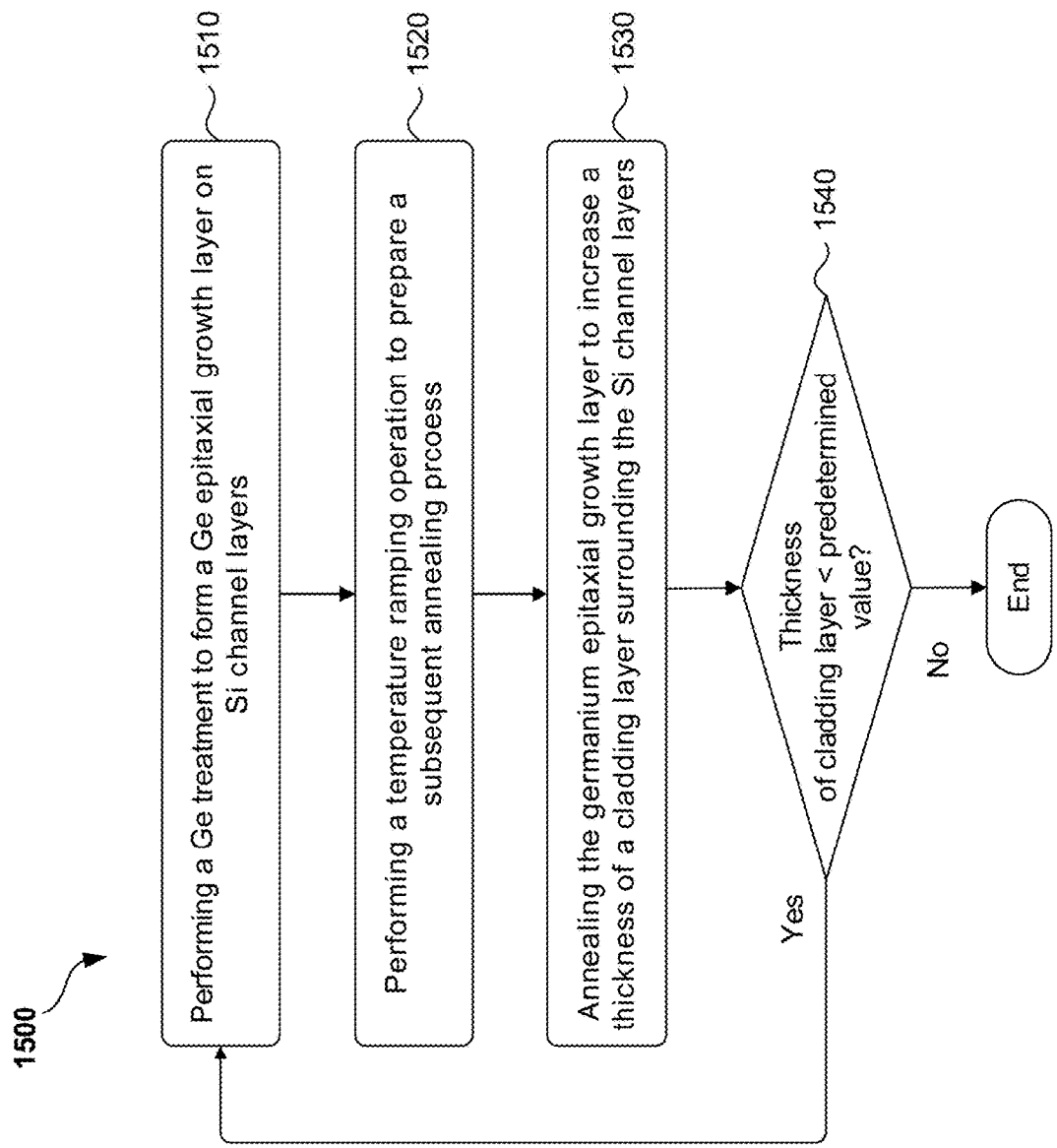
FIG. 15 is a flow diagram of a method for fabricating a channel structure, in accordance with some other embodiments.

FIGS. 10 and 15 are flow diagrams of two example processes 1000 and 1500 for operation 220 of forming channel structures according to some embodiments. FIG. 11A-11B are cross-sectional views of a portion of a channel structure at various stages of process 1000, in accordance with some embodiments. FIG. 16A-16D are cross-sectional views of a portion of a channel structure at various stages of process 1500, in accordance with some embodiments.

Referring to FIG. 10, in operation 1010, a Ge treatment is performed on exposed surfaces of the remaining nanostructured layers in the superlattice structure. For example, pure Ge can be deposited on outer surfaces of nanostructured layers 121 that are exposed by gate openings 412 and 422 (shown in FIGS. 6A-6B). In some embodiments, the nanostructured layers 121 are Si nano-sized layers, and the Ge treatment can be performed by using a CVD process. In some embodiments, the precursor process gas can be germane ($GeH_4$), digermane ($Ge_2H_6$), and/or higher order germane ($Ge_{>2}H_{>6}$) having a percentage concentration ranging from about 0.1% to about 100%. A precursor process gas partial pressure (PP) can range from about 0.001 mTorr to about 100 mTorr. A carrier gas can be $H_2$, $N_2$, Ar, He, or a combination thereof. A Ge treatment time can be within a range from about 1 second to about 10,000 seconds, according to some embodiments.

In some embodiments, a Ge reacting gas can be $GeH_4$ gas, a PP of the CVD process can be less than about $4\times10^{-3}$ Torr (4 mT). A total pressure of the reactor chamber can be less than about 30 Torr. A duration time of the Ge treatment can be less than or equal to about 1300 seconds. After operation 1010, a Ge layer 1120 with a thickness tc can be formed on Si layer 1110 with a thickness $t_1$, as shown in FIG. 11A. In some embodiments, a top surface of Ge layer 1120 is not uniform. Ge layer 1120 can include a plurality of Ge three-dimensional (3D) islands 1125, as shown in FIG. 11A.

Figure 12C:
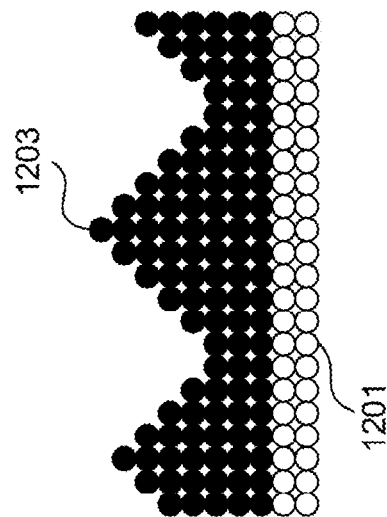
FIG. 12A-12C are cross-sectional views of germanium (Ge) epitaxy growth on a Si layer, in accordance with various embodiments.
Figure 12B:
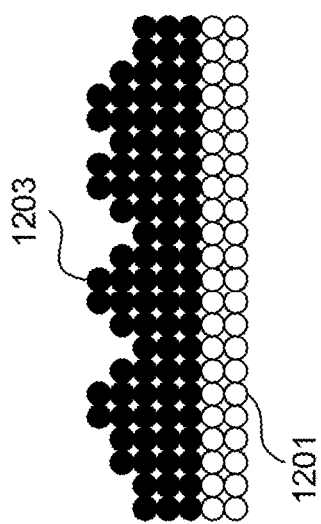
Figure 12A:
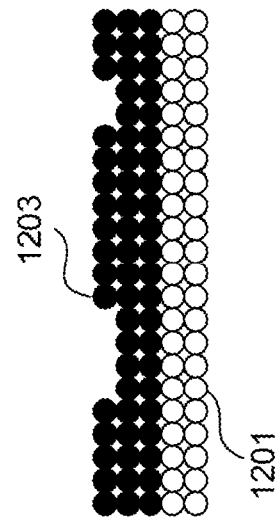

When performing a Ge treatment to a Si surface, there can be about 4.2% lattice mismatch between Ge atoms that have a diameter of about 0.565 nm and Si atoms that have a diameter of about 0.543 nm. According to a Stranski-Kranstanov (S.K.) mode, a critical thickness of epitaxial growth of Ge atoms on Si atoms is about 3.5 monolayer (ML) of Ge atoms (for Ge, 1 ML is about 0.141 nm which equals about $6.3\times10^{14}$ atoms/cm$^2$, and for Si, 1 ML is about 0.135 nm). As shown in FIG. 12A, Ge atoms 1203 can grow layer by layer on Si atoms 1201 when the thickness of Ge epitaxial growth layer is less than the critical thickness of about 3.5 ML. When the thickness of Ge epitaxial growth layer is larger than the critical thickness of about 3.5 ML, as shown in FIG. 12B, the location strain relaxation at some surface regions can cause three-dimensional (3D) islands of Ge atoms. When the thickness of Ge epitaxial growth layer is much larger than the critical thickness 3.5 ML, as shown in FIG. 12C, the strain relaxation between the Ge atom layer and the Si atom layer can cause macroscopic 3D islands of Ge atoms. To form a substantially uniform Ge layer on the Si channel layer, CVD process parameters should be selected to control the thickness of Ge epitaxial growth layer to be less than the critical thickness of about 3.5 ML.

Figure 13A:
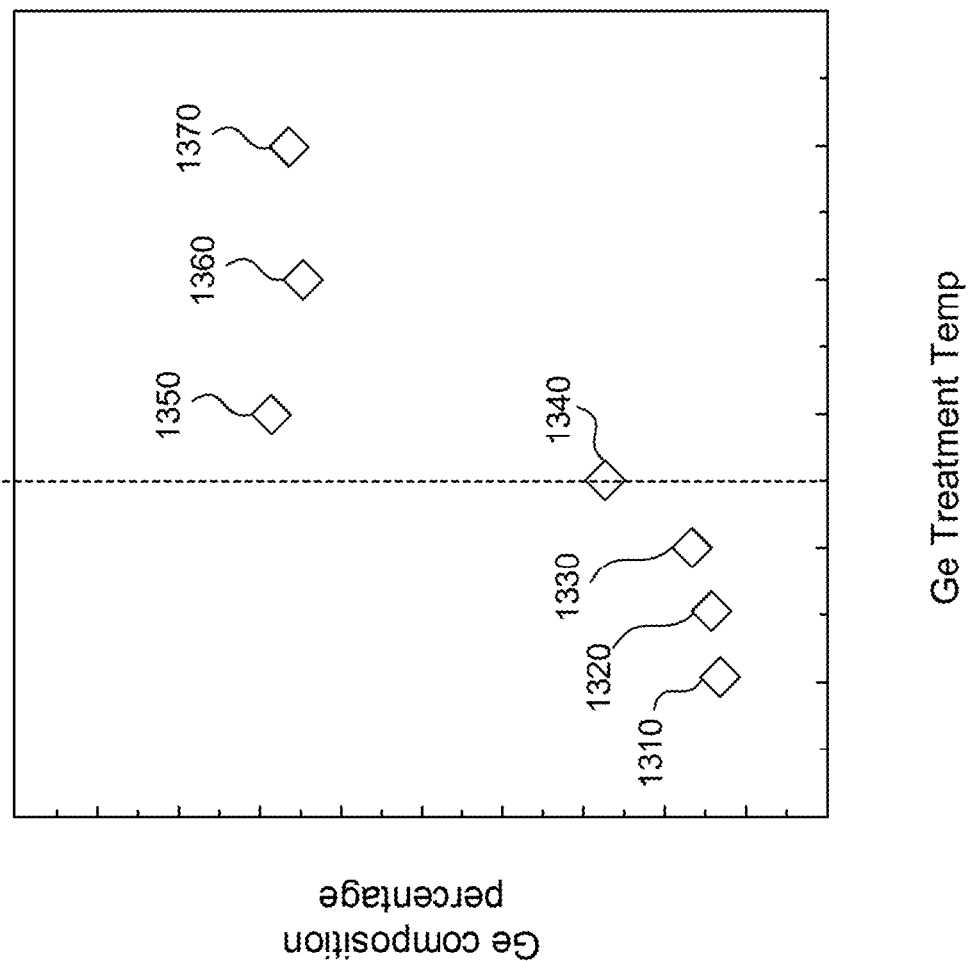
FIG. 13A is a diagram of Ge composition percentage versus Ge treatment temperature, according to some embodiments.

Referring to FIG. 13A, an example diagram of Ge composition percentage versus Ge treatment temperature is illustrated, according to some embodiments. At the conditions of using germane ($GeH_4$) as the reacting gas, under a PP about 18 mT (30 Torr), and keeping a Ge treatment time about 32 seconds, the Ge composition percentage of the formed Ge epitaxial growth layer increases as the Ge treatment temperature increases. As shown in FIG. 13A, points 1310, 1320, and 1330 illustrate that the Ge composition percentage of the channel surface after the Ge treatment at various temperatures (e.g., respective temperatures of about 400° C., about 425° C., and about 450° C.) can be, for example, between about 10% and about 20%. Point 1340 illustrates that the Ge composition percentage of the channel surface after the Ge treatment at a temperature of, for example, about 475° C. is between, for example, about 20% and about 30%. Points 1350, 1360, 1370 illustrate that the Ge composition percentage of the channel surface after the Ge treatment at respective temperatures of, for example, about 500° C., about 550° C., and about 600° C. is larger than, for example, about 60%. However, the top surfaces of the formed Ge layer corresponding to points 1310, 1320, and 1330 can be smooth, the top surface of the formed Ge layer corresponding to point 1340 can include few small 3D islands, while the top surfaces of the formed Ge layer corresponding to points 1350, 1360, and 1370 can include many macroscopic 3D islands. Accordingly, an upper level of the Ge treatment temperature can be determined as, for example, about 450° C.

Figure 13B:
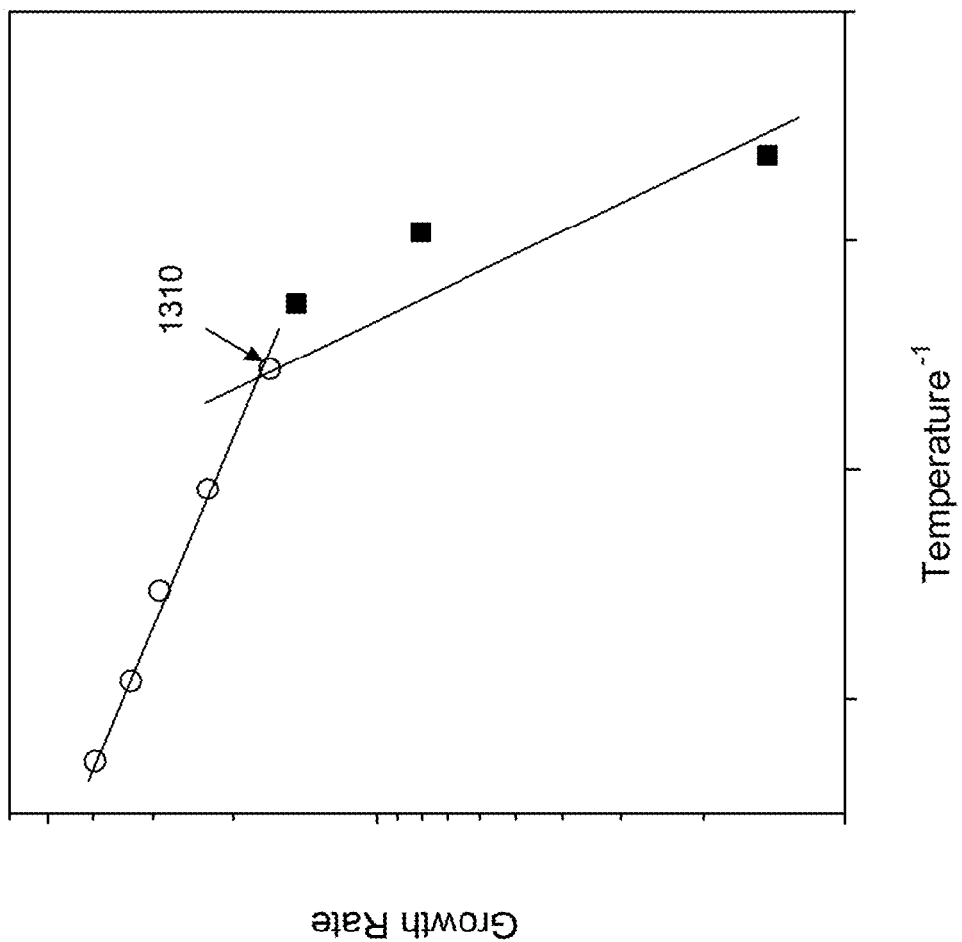
FIG. 13B is a diagram of Ge growth rate versus Ge treatment temperature, according to some embodiments.

Referring to FIG. 13B, an example diagram of Ge growth rate versus Ge treatment temperature is illustrated, according to some embodiments. The chemical formula of the chamber reaction is $GeH_4 \rightarrow Ge+2H_2$. Since the reaction is limited by a supply of reactant, and the reactant transport is affected by pattern geometry and aspect ratio, the mass transport is limited in a temperature range, for example, from about 400° C. to about 600° C. The hollow circular points in FIG. 13B illustrate the Ge growth rate is substantially exponentially proportional to the reciprocal of temperature with a first slope in a first temperate range, for example, from about 400° C. to about 600° C. Further, the reaction is also limited by the reaction rate, which is temperature dependent. The surface reaction has a less pattern effect at a lower temperature, e.g., at a temperature lower than about 400° C. Thus, the surface reaction is limited in a temperature range, for example, from about 325° C. to about 400° C. The solid square points in FIG. 13B illustrate the Ge growth rate is substantially exponentially proportional to the reciprocal of temperature with a second slope in a second temperate range, for example, from about 325° C. to about 400° C. The cross point 1310 of the straight lines fitting the two sets of data points, based on the mass transport limitation and the surface reaction limitation, is at a temperature of, for example, about 400° C. Therefore, the Ge treatment temperature can be determined within a range, for example, from about 350° C. to about 450° C. A preferred Ge treatment temperature can be determined, for example, at about 400° C.

Figure 13C:
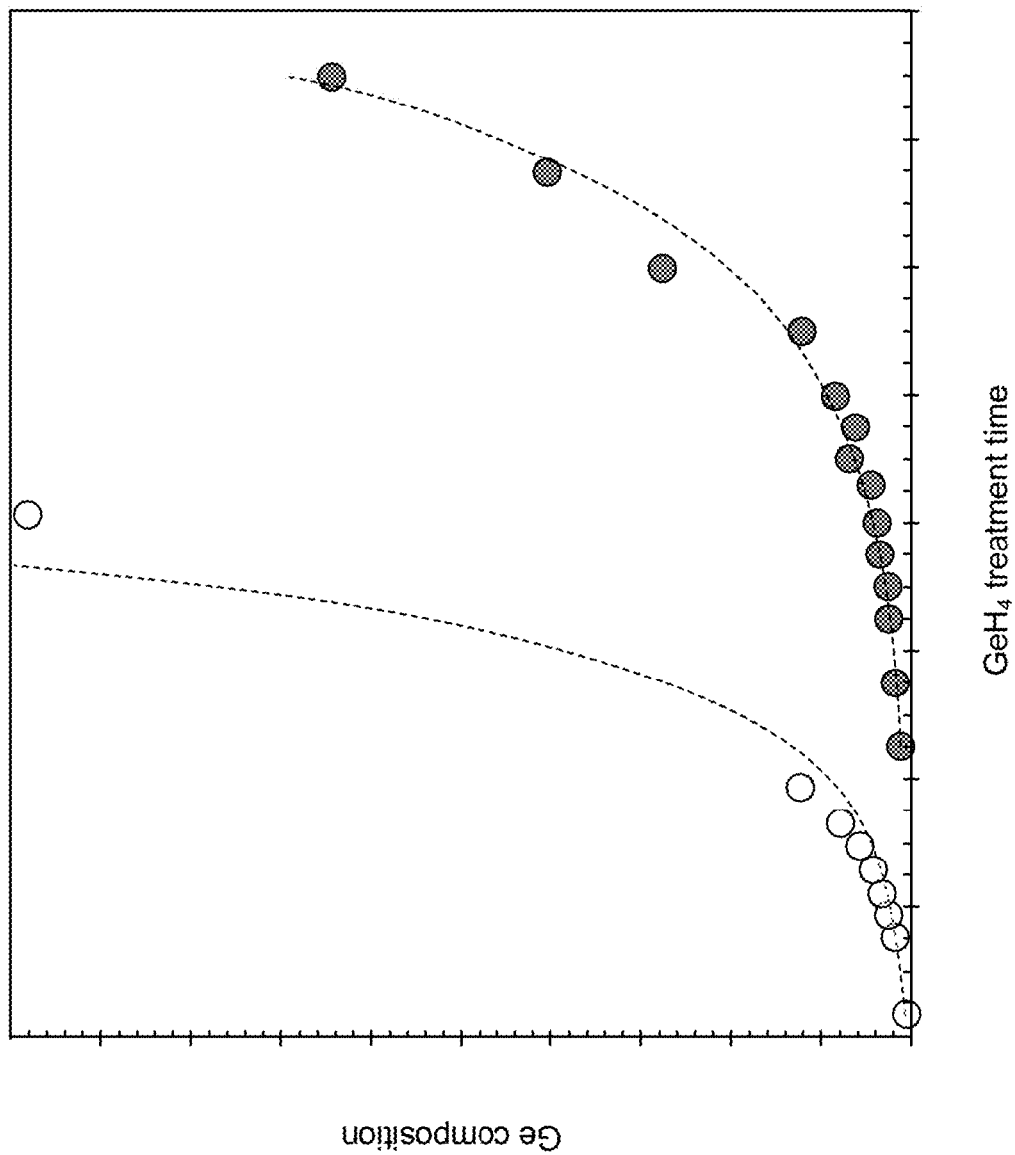
FIG. 13C is a diagram of Ge composition percentage versus germane ($GeH_4$) treatment time, according to some embodiments.

Referring to FIG. 13C, an example diagram of Ge composition percentage versus $GeH_4$ treatment time is illustrated, according to some embodiments. The Ge composition percentage of the formed Ge epitaxial growth layer depends on $GeH_4$ treatment time, which can be controlled by CVD process time. FIG. 13C shows that the Ge composition percentage increases as the $GeH_4$ treatment time increases, when using $H_2$ as the ambient and at a temperature of, for example, about 400° C. The hollow circular points correspond to a condition of the $GeH_4$ PP of the CVD process of, for example, about 18 mT, while the solid circular points correspond to a condition of $GeH_4$ PP of, for example, about 4 mT. Thus, additional Ge composition percentage can be obtained with a higher $GeH_4$ PP during the same treatment time.

Figure 14C:
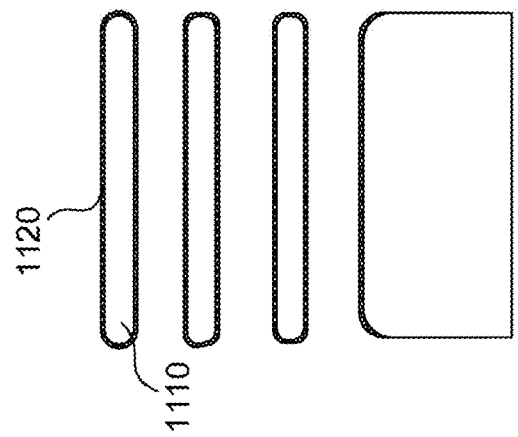
FIGS. 14A-14C are cross-sectional views of a Ge layer growing on a silicon (Si) layer under various conditions, in accordance with some embodiments.
Figure 14B:
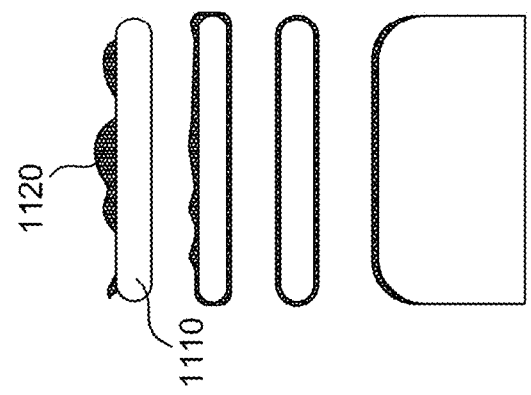
Figure 14A:
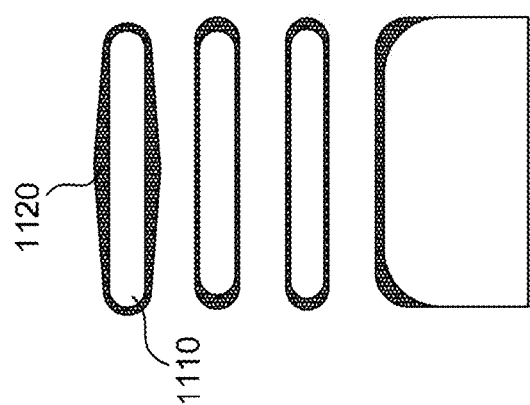

Referring to FIGS. 14A-14C, example cross-sectional views of formed Ge epitaxial growth layers on Si channel layers under different $GeH_4$ PPs are illustrated, according to some embodiments. Referring to FIG. 14A, under a CVD condition of $GeH_4$ PP of about 180 mT and a chamber pressure about 300 Torr, the formed Ge epitaxial growth layers 1120 on Si channel layers 1100 are not uniform. Referring to FIG. 14B, under a CVD condition of $GeH_4$ PP of about 18 mT and a chamber pressure about 30 Torr, the formed Ge epitaxial growth layers 1120 on Si channel layers 1100 are not uniform. Referring to FIG. 14C, under a CVD condition of $GeH_4$ PP of about 4 mT and a chamber pressure of about 7 Torr, the formed Ge epitaxial growth layers 1120 on Si channel layers 1100 are substantially uniform. Therefore, the $GeH_4$ PP less than about 18 mT can improve Ge uniformity on nanosheet patterns.

Based on the above discussion, in some embodiments, the CVD process parameters for the Ge treatment operation (e.g., operation 1010 in FIG. 10) can be controlled based on the following: a process temperature at about 400° C., a $GeH_4$ partial pressure at about 4 mTorr, a process pressure at about 7 Torr, a process time of operation 1010 between 8 seconds and 1300 seconds, and a process ambient as Hz.

Referring to FIG. 10, in operation 1020, a temperature ramping operation is performed, to prepare for a subsequent annealing process. In some embodiments, the above CVD process conditions during operation 1010 can be gradually changed in operation 1020. For example, during the temperature ramping operation, the process temperature can be gradually increased from about 400° C. to about 750° C., the $GeH_4$ partial pressure can be gradually decreased from about 4 mTorr to about 0 mTorr, and the process pressure can be gradually increased from about 7 Torr to about 30 Torr. A process time of the temperature ramping operation 1020 can be about 600 seconds.

Referring to FIG. 10, in operation 1030, an in-situ or ex-situ thermal annealing operation is performed for (i) SiGe alloying, (ii) smoothing the surface of the formed SiGe layer, and (iii) surface Ge atoms thermal diffusion. In some embodiments, the in-situ annealing process can be a reflection high energy electron diffraction (RHEED) process, and the ex-situ annealing process can be scanning electron microscopy (SEM), atomic force microscopy (AFM), or photoluminescence. In some embodiments, the annealing process can be performed at an annealing temperature between about 450° C. and about 1200° C. An annealing ambient can be $H_2$, $N_2$, Ar, He, or a combination thereof. An annealing process pressure can be within a range from about 0.1 mT to about 22,800 Torr. An annealing process time can be within a range from 1 microsecond (μs) to about 3600 seconds. In some examples, the in-situ or ex-situ annealing process can be performed at a temperature between about 500° C. and about 800° C. (e.g., about 750° C.) in an $H_2$ ambient, the process pressure can be about 30 Torr, and a process time of the annealing operation 1030 can be about 250 seconds.

In some embodiments, when the Ge composition percentage of the Ge epitaxial growth layer 1120 formed in operation 1010 is larger than about 2.5%, the Ge 3D islands 1125 as shown in FIG. 11A can be smooth by the annealing operation. However, when the Ge composition percentage of the formed Ge epitaxial growth layer 1120 is larger than about 30% (e.g., formed by a Ge treatment time greater than 1300 s), the surface morphology may be non-uniform after the annealing process. In a first example, a $GeH_4$ PP of about 4 mT and a Ge treatment time of about 600 seconds can form a smooth Ge epitaxial growth layer 1120 with a Ge composition percentage of about 2.3%. After an in-situ annealing operation at about 650° C. in an $H_2$ ambient for about 250 seconds, the formed GeSi layer can have a smooth surface and a Ge composition percentage of about 2.1%. In a second example, a $GeH_4$ PP of about 4 mT and a Ge treatment time of about 900 seconds can form a smooth Ge epitaxial growth layer 1120 with a Ge composition percentage of about 6.6%. After an in-situ annealing operation at about 650° C. in an $H_2$ ambient for about 250 seconds, the formed GeSi layer can have a smooth surface and a Ge composition percentage of about 6%. In a third example, a $GeH_4$ PP of about 4 mT and a Ge treatment time of about 1200 seconds can form a Ge epitaxial growth layer 1120 with 3D Ge islands and a Ge composition percentage of about 27.5%. After an in-situ annealing operation at about 650° C. in an $H_2$ ambient for about 250 seconds, the formed GeSi layer can have a smooth surface and a Ge composition percentage of about 25%. In a fourth example, a $GeH_4$ PP of about 4 mT and a Ge treatment time of about 1350 seconds can form a Ge epitaxial growth layer 1120 with 3D Ge islands and a Ge composition percentage of about 40.5%. After an in-situ annealing operation at about 650° C. in an $H_2$ ambient for about 250 seconds, the formed GeSi layer can still have 3D Ge islands and a Ge composition percentage of about 30.1%.

If the formed Ge epitaxial growth layer 1120 includes too many 3D islands or the size of the 3D islands are too big, the 3D islands cannot be repaired by an annealing process. Accordingly, the Ge treatment time can be controlled to be less than about 1300 seconds and the Ge composition percentage of the Ge epitaxial growth layer can be controlled to be less than about 30%. A desired Ge composition percentage of the formed Ge layer can be in a range from about 20% to about 30%, such as about 25%.

As shown in FIG. 11B, after the annealing operation, the Ge atoms of the Ge epitaxial growth layer 1120 can thermally diffuse into underlayer Si channel 1110, such that the Ge atoms and Si atoms can form a SiGe alloy layer 1130. The formed SiGe alloy layer 1130 can have a substantially uniform shape on the remaining portion of Si layer 1140. The formed SiGe alloy layer 1130 can form cladding layer 115, and the remaining portion of Si layer 1140 can form channel layer 120, as described above in connection with FIGS. 1B-1D and 6A-9B. A thickness $t_3$ of SiGe alloy layer 1130 can be less than about 2 nm or less than about 1 nm. Further, since the Ge atoms thermally diffuse into the underlayer Si channel 1100, a total thickness of the SiGe alloy layer 1130 and the remaining portion of Si layer 1140 can be less than $(t_1+t_3)$.

In one example following the process 1000 as shown in FIG. 10, a GeH$_4$ PP of about 4 mT and a Ge treatment of about 1200 seconds can form a Ge epitaxial growth layer 1120 with 3D Ge islands having a height of about 3.04 nm and a Ge composition percentage of about 27.7%. After an in-situ annealing operation at about 750° C. in an H$_2$ ambient for about 250 seconds, the formed GeSi layer can have a smooth surface, a Ge composition percentage of about 24%, and a thickness ranging from about 0.87 nm to about 0.93 nm.

After the Ge treatment operation 1010, the formed Ge islands may have a height larger than about 5 nm in some undesired situations. Such Ge islands may merge with adjacent Ge epitaxial growth layer 1120 in scaled down device structures, such as in nanosheets (e.g., sheet to sheet spacing 11 nm or below), nanowires, and finFETs. Once merged, the Ge islands occur after Ge treatment operation 1100 with increased risk of not forming a uniform and thin Ge or GeSi cladding layer 1120 after the annealing operation 1300, resulting in deteriorated device performance.

Referring to FIG. 15, a flow diagram of a second example process 1500 for operation 220 of forming channel structures is shown according to some embodiments. FIG. 16A-16D are cross-sectional views of a portion of a channel structure at various stages of process 1500, according to various embodiments. In some embodiments, a cyclic Ge treatment operation 1510, temperature ramping operation 1520, and annealing operation 1530 are performed to prevent surface morphology degradation.

As described above in connection with FIG. 12A, Ge atoms 1203 can growth layer by layer on Si atoms 1201 when the thickness of Ge epitaxial growth layer is less than the critical thickness (e.g., 3.5 ML). Therefore, in each cycle of Ge treatment operation 1510, the CVD parameters (e.g., Ge treatment time) can be controlled to keep the Ge growth thickness less than the critical thickness to prevent surface morphology degradation.

In some embodiments, the CVD parameters corresponding to the critical thickness can be determined by manipulating a Ge treatment time in a specific process regime. In a first CVD process example, at about 400° C. and under 1% GeH$_4$ PP of about 4 mT, in an H$_2$ ambient, and a Ge treatment time of about 650 seconds, a Ge epitaxial growth layer can be formed. The Ge epitaxial growth layer can reach the critical thickness, which means that the Ge deposition passes through from 2D growth to 3D growth after about 650 seconds after starting the Ge treatment to generate an increasing number of Ge islands on the Si surface. In a second CVD process example, at about 400° C. and under 1% GeH$_4$ PP of about 18 mT, in an H$_2$ ambient, and a Ge treatment time of about 220 seconds, the Ge epitaxial growth layer can reach the critical thickness.

Figure 16B:
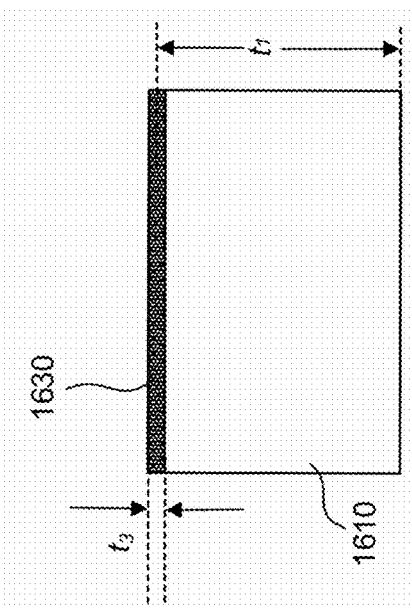
FIG. 16A-16D are cross-sectional views of a portion of a channel structure at various stages of method of FIG. 15, in accordance with some embodiments.
Figure 16A:
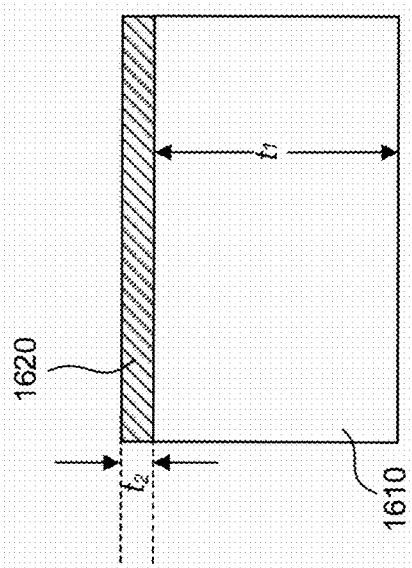
Figure 16D:
Figure 16C:
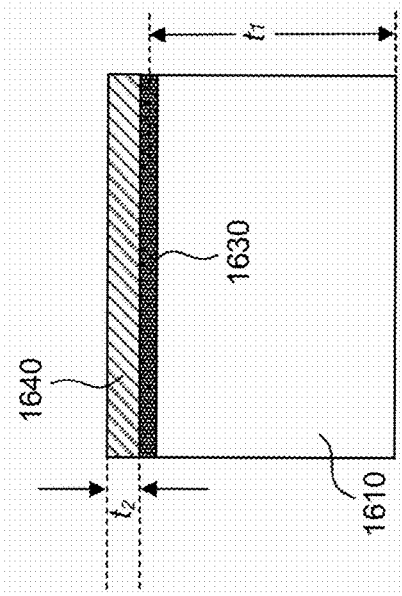

After a first Ge treatment operation 1510, the surface morphology is non-degraded (e.g., no visible Ge island formation) when certain CVD parameters are controlled to keep the Ge growth thickness less than the critical thickness. As shown in FIG. 16A, the formed Ge epitaxial growth layer 1620 on the Si layer 1610 can have a flat top surface. The thickness t$_2$ of Ge epitaxial growth layer 1620 is less than the critical thickness t$_c$.

After the first temperature ramping operation 1520 and first annealing operation 1530, the thickness t$_3$ of the formed GeSi alloy layer 1630 may not meet requirements for semiconductor device performance. To formed a desired thickness of cladding layer 115 (e.g., GeSi alloy layer 1630) or surface Ge composition, Ge treatment operation 1510, temperature ramping operation 1520 and annealing operation 1530 can be cyclic repeated one or more times. For example, if it is determined that the thickness of cladding layer 115 does not reach the desired thickness at operation 1540, the 2nd, 3rd, 4th, and so forth cycles of Ge treatment operation 1510, temperature ramping operation 1520, and annealing operation 1530 can be performed sequentially to form additional Ge epitaxial growth layer 1640 and to increase the thickness t$_4$ of GeSi alloy layer 1650 and surface Ge composition. The Ge treatment time, annealing time, and the annealing temperature can be different for each cycle, according to some embodiments. The cyclic repetition of Ge treatment operation 1510, temperature ramping operation 1520, and annealing operation 1530 can be stopped when thickness t$_4$ of GeSi alloy layer 1650 and/or surface Ge composition meet design requirements.

Although each Ge treatment operation 1510 does not generate Ge islands on the formed Ge epitaxial growth layer, an in-situ or ex-situ annealing operation 1530 may be required to be performed before a next cycle of Ge treatment operation 1510. Without annealing operation 1530 between each Ge treatment operation 1510, Ge islands may appear when forming Ge epitaxial growth layer on GeSi alloy layer, resulting in degradation of surface morphology.

In a first example of performing process 1000 including a single Ge treatment at about 400° C. and in an H$_2$ ambient, Ge islands may appear at the surface of Ge epitaxial growth layer when the Ge composition percentage is larger than about 2.5%. In a second example of performing process 1500 including 8 cycles of Ge treatments under the same CVD conditions, Ge islands may appear at the surface of Ge epitaxial growth layer when the Ge composition percentage reaches about 25%, which is about a significant increase (e.g., about 10× increase) compared to the first example.

The present disclosure provides example multi-Vt devices (e.g., semiconductor device 100) with FETs (e.g., finFETs or GAA FETs) having an improved channel structure configurations. A thin substantially uniform Ge cladding layer wrapped around the Si channel layer is critical for Ge tuning pFET Vth in scaled down advanced device structures (e.g. finFETs, nanowire, nanosheet). The present disclosure also provides fabricating methods to form the thin substantially uniform Ge cladding layer without constrained by pattern geometry by using reduced pressure CVD tools at specific design process conditions.

In some embodiments, the present disclosure provides a method for forming a channel structure of a semiconductor device. The method can include forming a superlattice structure including a plurality of first nanostructured layers and a plurality of second nanostructured layers on a fin structure; removing the plurality of second nanostructured layers to form a plurality of gate openings; forming a germanium epitaxial growth layer on the plurality of first nanostructured layers at a first temperature and a first pressure; increasing the first temperature to a second temperature and increasing the first pressure to a second pressure over a first predetermined period of time; and annealing the germanium epitaxial growth layer at the second temperature and the second pressure in the chamber over a second predetermined period of time to form a cladding layer surrounding the first nanostructured layers.

In some embodiments, the present disclosure provides a method for forming a channel structure of a semiconductor device. The method can include forming a germanium epitaxial growth layer on nanostructured layers at a first temperature and a first pressure; increasing the first temperature to a second temperature and increasing the first pressure to a second pressure over a first predetermined time period of time; annealing the germanium epitaxial growth layer at the second temperature and the second pressure over a second predetermined time period of time to increase a thickness of a cladding layer surrounding the nanostructured layers. The method can include repeating these operations.

In some embodiments, the present disclosure provides a semiconductor device. The semiconductor device can include a substrate and a fin structure disposed on the substrate; a channel structure disposed on the fin structure; a channel layer and a cladding layer on surfaces of the channel layer. A thickness of the cladding layer can be less than about 2 nm. The semiconductor device can also include a gate structure disposed on the channel structure.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a superlattice structure comprising a plurality of first nanostructured layers and a plurality of second nanostructured layers on a substrate;
   removing the plurality of second nanostructured layers to form a plurality of gate openings;
   forming a germanium epitaxial layer on the plurality of first nanostructured layers at a first temperature;
   performing a temperature ramping process for a first period of time to increase the first temperature to a second temperature; and
   annealing the germanium epitaxial layer at the second temperature for a second period of time to form a cladding layer surrounding the plurality of first nanostructured layers.

2. The method of claim 1, wherein the first period of time is greater than the second period of time.

3. The method of claim 1, wherein forming the germanium epitaxial layer comprises performing a chemical vapor deposition (CVD) process with a precursor process gas of germane ($GeH_4$), digermane ($Ge_2H_6$), higher order germane ($Ge_{>2}H_{>6}$), or a combination thereof.

4. The method of claim 1, wherein forming the germanium epitaxial layer comprises using a physical vapor deposition (PVD) process, a molecular beam epitaxy (MBE) process, or an atomic layer deposition (ALD) process.

5. The method of claim 1, wherein forming the germanium epitaxial layer comprises forming the germanium epitaxial layer with one or more three-dimensional germanium islands.

6. The method of claim 5, wherein annealing the germanium epitaxial layer comprises removing the one or more three-dimensional germanium islands from surfaces of the cladding layer.

7. The method of claim 1, wherein annealing the germanium epitaxial layer comprises performing an in-situ annealing process on the germanium epitaxial layer to diffuse germanium atoms of the germanium epitaxial layer into the plurality of first nanostructured layers and form the cladding layer comprising a germanium-silicon alloy layer.

8. The method of claim 1, wherein annealing the germanium epitaxial layer comprises performing the annealing at an annealing temperature between about 450° C. and about 1200° C.

9. A method, comprising:
   performing an epitaxial process at a first temperature on nanostructured layers on a substrate to form a germanium epitaxial layer on the nanostructured layers;
   performing a temperature ramping process for a first period of time to increase the first temperature to a second temperature;
   performing an annealing process on the germanium epitaxial layer at the second temperature for a second period of time to form a cladding layer with a first thickness surrounding the nanostructured layers; and
   forming a gate structure on the cladding layer.

10. The method of claim 9, wherein the first period of time is greater than the second period of time.

11. The method of claim 9, wherein performing the epitaxial process comprises performing a chemical vapor deposition (CVD) process with a precursor process gas of germane ($GeH_4$), digermane ($Ge_2H_6$), higher order germane ($Ge_{>2}H_{>6}$), or a combination thereof.

12. The method of claim 9, wherein performing the epitaxial process comprises using a physical vapor deposition (PVD) process, a molecular beam epitaxy (MBE) process, or an atomic layer deposition (ALD) process.

13. The method of claim 9, further comprising repeating the epitaxial process, the temperature ramping process, and the annealing process on the cladding layer to increase the first thickness of the cladding layer to a second thickness.

14. The method of claim 9, wherein performing the annealing process on the germanium epitaxial layer comprises performing the annealing process at an annealing temperature between about 450° C. and about 1200° C. for an annealing time between about 1 microsecond and about 3600 seconds.

15. The method of claim 9, wherein performing the annealing process on the germanium epitaxial layer comprises performing an in-situ annealing process.

16. A method, comprising:
   forming nanostructured layers on a substrate;
   forming a source/drain (S/D) region adjacent to the nanostructured layers;
   forming a silicon-germanium alloy layer surrounding the nanostructured layers, wherein forming the silicon-germanium alloy layer comprises:
      epitaxially growing a germanium layer on the nanostructured layers, and
      performing an annealing process on the germanium layer; and
   forming a gate structure on the silicon-germanium alloy layer.

17. The method of claim 16, wherein epitaxially growing the germanium layer comprises epitaxially growing the germanium layer with three-dimension islands on a top surface of the germanium layer.

18. The method of claim 16, wherein performing the annealing process comprises performing an in-situ annealing process.

19. The method of claim 16, further comprising epitaxially growing another germanium layer on the silicon-germanium alloy layer.

20. The method of claim 19, further comprising performing another annealing process on the other germanium layer.

* * * * *